United States Patent
Kameyama et al.

(10) Patent No.: US 9,570,353 B1
(45) Date of Patent: Feb. 14, 2017

(54) METHOD FOR MANUFACTURING SEMICONDUCTOR DEVICE

(71) Applicant: TOYOTA JIDOSHA KABUSHIKI KAISHA, Toyota-shi, Aichi-ken (JP)

(72) Inventors: Satoru Kameyama, Toyota (JP); Shinya Iwasaki, Toyota (JP); Yuki Yakushigawa, Toyota (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 15/210,260

(22) Filed: Jul. 14, 2016

(30) Foreign Application Priority Data

Jul. 21, 2015 (JP) .................................. 2015-144049

(51) Int. Cl.

| H01L 21/66 | (2006.01) |
|---|---|
| H01L 21/78 | (2006.01) |
| H01L 21/768 | (2006.01) |
| H01L 21/3205 | (2006.01) |
| H01L 21/3213 | (2006.01) |
| H01L 29/66 | (2006.01) |

(52) U.S. Cl.
CPC .......... *H01L 21/78* (2013.01); *H01L 21/3213* (2013.01); *H01L 21/32051* (2013.01); *H01L 21/76816* (2013.01); *H01L 21/76843* (2013.01); *H01L 21/76877* (2013.01); *H01L 22/20* (2013.01); *H01L 29/66325* (2013.01)

(58) Field of Classification Search
None
See application file for complete search history.

(56) References Cited

U.S. PATENT DOCUMENTS

| 5,286,673 | A | * | 2/1994 | Nishihara | ......... | H01L 21/76816 257/E21.507 |
|---|---|---|---|---|---|---|
| 6,077,633 | A | * | 6/2000 | Lin | .................... | H01L 21/76816 257/E21.577 |
| 7,005,755 | B2 | * | 2/2006 | Yoshimura | ........ | H01L 21/76264 257/283 |
| 2001/0019880 | A1 | * | 9/2001 | Ebertseder | ............ | H01L 23/544 438/584 |
| 2002/0177325 | A1 | * | 11/2002 | Takewaka | ......... | H01L 21/28556 438/745 |

FOREIGN PATENT DOCUMENTS

JP    2014-192351 A    10/2014

* cited by examiner

*Primary Examiner* — Asok K Sarkar
(74) *Attorney, Agent, or Firm* — Oliff PLC

(57) ABSTRACT

A method for manufacturing a semiconductor device is provided. The method includes forming of an interlayer insulating film on a semiconductor substrate; etching the interlayer insulating film to form a contact hole and an alignment hole wider than the contact hole; depositing a first metal layer having a thickness thicker than a half of the width of the contact hole and thinner than a half of the width of the alignment hole; etching the first metal layer so that a bottom surface of the alignment hole are exposed and the first metal layer remains covering a bottom surface of the contact hole; treating the semiconductor substrate based on the position of the alignment hole; and cutting a part of the semiconductor substrate including the alignment hole to divide a semiconductor device having the contact hole from the semiconductor substrate.

3 Claims, 21 Drawing Sheets

METHOD FOR MANUFACTURING SEMICONDUCTOR DEVICE

CROSS-REFERENCE TO RELATED APPLICATION

This application claims priority to Japanese Patent Application No. 2015-144049 filed on Jul. 21, 2015, the entire contents of which are hereby incorporated by reference into the present application.

TECHNICAL FIELD

A technique disclosed in the present disclosure relates to a method for manufacturing a semiconductor device.

DESCRIPTION OF RELATED ART

A semiconductor device in Japanese Patent Application Publication No. 2014-192351 A has a semiconductor substrate, an interlayer insulating film provided on the semiconductor substrate, and an emitter electrode provided on the interlayer insulating film. Moreover, a contact hole is provided in the interlayer insulating film. A metal layer is disposed in the contact hole. The metal layer in the contact hole connects the emitter electrode to the semiconductor substrate.

SUMMARY

In a process of manufacturing a semiconductor device, there may be a case where an alignment mark is provided on a surface of a dicing portion (a part to be cut later) of a semiconductor substrate. The alignment mark is utilized for adjusting a position when a treatment is conducted on the semiconductor substrate (e.g., subjected to patterning of an electrode, patterning of an insulating layer, ion implantation, and the like). In a case where an interlayer insulating film is provided on the semiconductor substrate, a hole (hereinafter referred to as an alignment hole) may be in some cases formed in the interlayer insulating film in the dicing portion, and the alignment hole may be utilized as an alignment mark. In this case, the alignment hole is formed concurrently with the above-mentioned contact hole. After the contact hole and the alignment hole are formed, a metal layer is deposited in the contact hole. At this occasion, the metal layer is also deposited on the interlayer insulating film and in the alignment hole. Next, the metal layer is etched to remain in the contact hole, to thereby remove an unnecessary part of the metal layer on the interlayer insulating film. At this occasion, the metal layer also remains in the alignment hole. Afterwards, when the dicing portion (i.e., a part that includes the alignment hole) is cut, the metal layer in the alignment hole is shaved, causing metal cutting chips. There may be a case where the metal cutting chips cause a scratch on the semiconductor device. Accordingly, there occurs a problem of a decrease in manufacturing yield of semiconductor devices.

A manufacturing method of a semiconductor device is provided herein. The method comprises formation of an interlayer insulating film, etching of the interlayer insulating film, deposition of a first metal layer, etching of the first metal layer, treatment of a semiconductor substrate, and cutting of the semiconductor substrate. In the formation of the interlayer insulating film, the interlayer insulating film is formed on the semiconductor substrate. In the etching of the interlayer insulating film, a part of the interlayer insulating film is etched to form a contact hole and an alignment hole in the interlayer insulating film. The alignment hole has a width wider than a width of the contact hole. In the deposition of the first metal layer, the first metal layer is deposited on a surface of the interlayer insulating film, an inner surface of the contact hole, and an inner surface of the alignment hole. The first metal layer has a thickness thicker than a half of the width of the contact hole and thinner than a half of the width of the alignment hole. In the etching of the first metal layer, the first metal layer is etched so that the surface of the interlayer insulating film and a bottom surface of the alignment hole are exposed and the first metal layer remains covering a bottom surface of the contact hole. In the treatment of semiconductor substrate, a position of the alignment hole is sensed and the semiconductor substrate is treated based on the sensed position of the alignment hole. In the cutting of the semiconductor substrate, a part of the semiconductor substrate including the alignment hole is cut to divide a semiconductor device having the contact hole from the semiconductor substrate.

Notably, the interlayer insulating film may be formed to be in direct contact with the semiconductor substrate, or may be formed so that another layer (e.g., a conductive layer or an insulating layer) is interposed between the semiconductor substrate and the interlayer insulating film. Moreover, the width of the contact hole and the width of the alignment hole, described above, mean a width of the contact hole and a width of the alignment hole when the surface of the interlayer insulating film is seen in a plan view (if each of these has an elongated shape, the dimensions in a short-side direction), respectively. Moreover, regarding the bottom surface of the alignment hole being exposed, the entire bottom surface of the alignment hole may be exposed, or a part of the bottom surface of the alignment hole may be exposed. Moreover, the treatment of the semiconductor substrate may be, for example, etching the semiconductor substrate, etching respective layers (a conductive layer, an insulating layer, a mask for processing) at the surface of the semiconductor substrate, implanting ions into the semiconductor substrate, and the like.

In this manufacturing method, the alignment hole having the width wider than the contact hole is formed in the etching of the interlayer insulating film. The alignment hole is formed in the part to be cut in the cutting which is performed later (i.e., the dicing portion). In the depositing of the first metal layer, the thickness of the first metal layer is thicker than a half of the width of the contact hole, and hence portions of the first metal layer deposited on both lateral surfaces of the contact hole, respectively, are connected at an approximately central portion of the contact hole. Accordingly, the contact hole is filled with the first metal layer. Consequently, the thickness of the first metal layer that covers the contact hole (i.e., a distance between the bottom surface of the contact hole and an upper surface of the first metal layer) becomes thicker than the thickness of the first metal layer on the interlayer insulating film. On the other hand, the thickness of the first metal layer is thinner than a half of the width of the alignment hole, and hence the first metal layer is approximately uniformly deposited in the alignment hole. Consequently, the thickness of the first metal layer in the alignment hole becomes approximately the same as the thickness of the first metal layer on the interlayer insulating film. In other words, the thickness of the first metal layer that covers the contact hole becomes thicker than the thickness of the first metal layer that covers the alignment hole. It is therefore possible, in the subsequent etching of the first metal layer, to expose the bottom surface of the alignment hole, and yet allow the first metal layer to remain covering the bottom surface of the contact hole. The first metal layer that remains in the contact hole functions as a wiring that is in contact with a layer located under the interlayer insulating film (e.g., the semiconductor substrate). When the etching of the first metal layer is completed, the semiconductor substrate is treated based on the position of the alignment hole in the treatment of the semiconductor substrate, and then the cutting is performed. In the cutting, the part of the semiconductor substrate including the alignment hole is cut. The semiconductor device having the contact hole is thereby divided from the semiconductor substrate. Most part of the first metal layer has been removed from the alignment hole, and hence generation of metal cutting chips attributable to the first metal layer is suppressed when the part including the alignment hole is cut. Accordingly, the surface of the semiconductor device is difficult to be damaged by the metal cutting chips. Therefore, according to this manufacturing method, the manufacturing yield of semiconductor devices can be improved.

DETAILED DESCRIPTION

Figure 1:
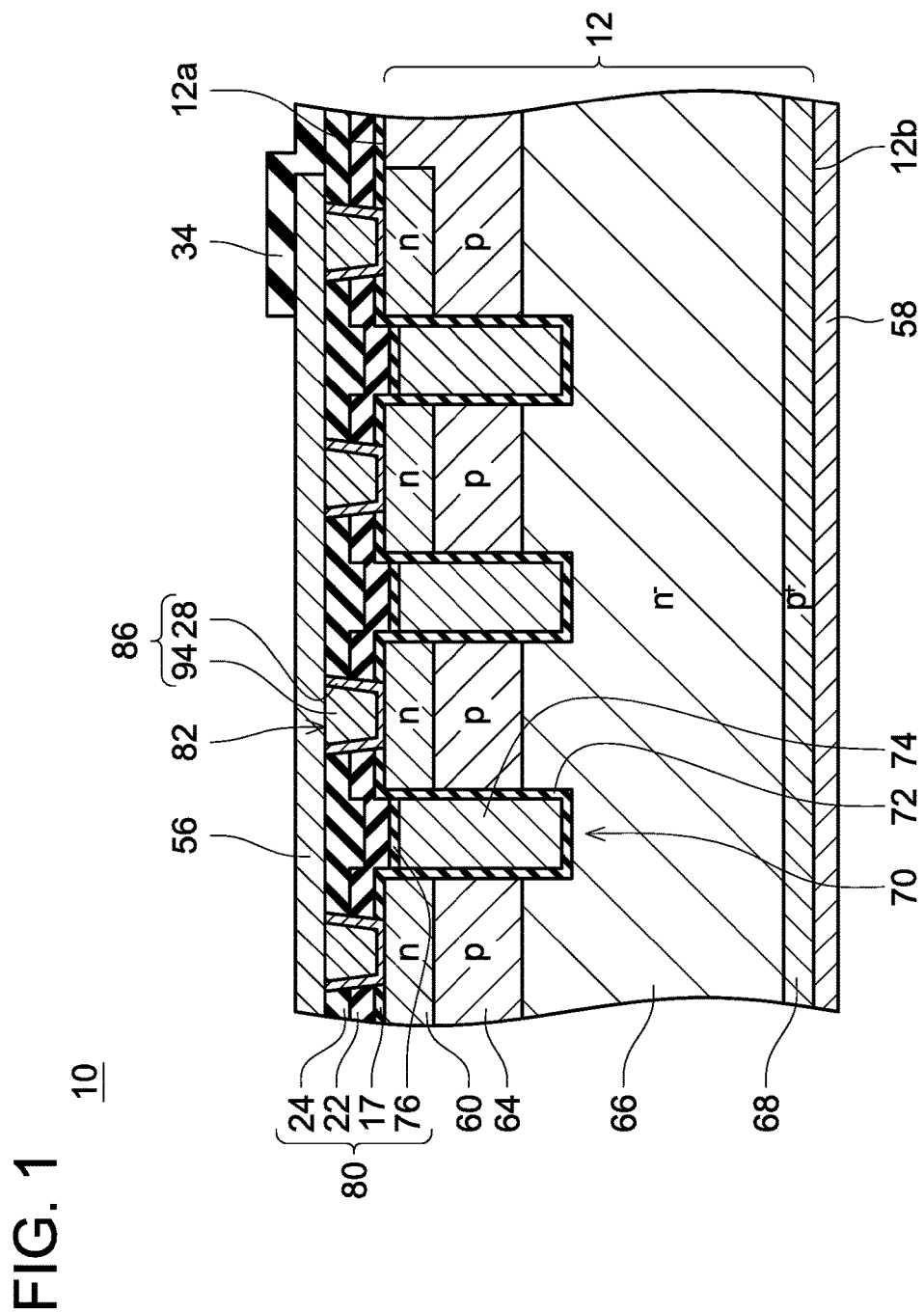
FIG. 1 shows a vertical cross-sectional view of a semiconductor device 10.

As shown in FIG. 1, a semiconductor device 10 in an embodiment has a semiconductor substrate 12. The semiconductor substrate 12 is made of silicon.

An IGBT is formed in the semiconductor substrate 12. The IGBT has a configuration as described below. In the semiconductor substrate 12, emitter regions 60, a body region 64, a drift region 66, and a collector region 68 are provided. The emitter regions 60 are of n-type, and provided at positions exposed on an upper surface 12a of the semiconductor substrate 12. The body region 64 is of p-type, and provided under the emitter regions 60. Moreover, the body region 64 is exposed on the upper surface 12a of the semiconductor substrate 12 at a position not shown. A p-type impurity concentration in the body region 64 is high at the part exposed on the upper surface 12a of the semiconductor substrate 12, and low at the other parts. The drift region 66 is of n-type, and provided under the body region 64. The collector region 68 is of p-type, and provided under the drift region 66. The collector region 68 is provided at a position exposed on a lower surface 12b of the semiconductor substrate 12.

A plurality of trenches 70 is provided in the upper surface 12a of the semiconductor substrate 12. Each of the trenches 70 extends long in a direction vertical to a paper surface of FIG. 1. The trenches 70 penetrate the emitter regions 60 and the body region 64, and reach the drift region 66. An inner surface of each trench 70 is covered with a gate insulating film 72. A gate electrode 74 is disposed in each trench 70. The gate electrode 74 is made of polysilicon doped with impurities. The gate electrode 74 is insulated from the semiconductor substrate 12 by the corresponding gate insulating film 72. The gate electrode 74 faces the corresponding emitter region 60, the body region 64, and the drift region 66, via the gate insulating film 72 interposed therebetween.

An interlayer insulating film 80 is provided on the upper surface 12a of the semiconductor substrate 12. The interlayer insulating film 80 is made of silicon oxide. The interlayer insulating film 80 has cap insulating films 76, a surface oxide film 17, an NSG film 22, and a BPSG film 24. Each cap insulating film 76 covers an upper surface of one gate electrode 74. The cap insulating film 76 is an insulating film obtained by oxidizing the gate electrode 74 (i.e., polysilicon). The surface oxide film 17 covers the upper surface 12a of the semiconductor substrate 12. The surface oxide film 17 is an insulating film obtained by oxidizing the semiconductor substrate 12 (i.e., a silicon single crystal). The NSG film 22 is a film made of NSG (Non-doped Silicon Glass). In other words, the NSG film 22 is a film made of silicon oxide which is neither doped with boron nor phosphorus. The NSG film 22 is provided on the cap insulating films 76 and the surface oxide film 17. The BPSG film 24 is a film made of BPSG (Boron Phosphorus Silicon Glass). In other words, the BPSG film 24 is a film made of silicon oxide doped with boron and phosphorus. The BPSG film 24 is provided on the NSG film 22.

A plurality of contact holes 82 is provided in the interlayer insulating film 80. Each contact hole 82 is provided above a region where a trench 70 is not provided. The contact hole 82 extends long in the direction vertical to the paper surface of FIG. 1 along the corresponding trench 70. The contact hole 82 penetrates the interlayer insulating film 80 from its upper surface to lower surface. A width of the contact hole 82 can be made to 1 μm or less, and is approximately 0.8 μm in the present embodiment. A bottom surface of the contact hole 82 is formed by the upper surface 12a of the semiconductor substrate 12. The corresponding emitter region 60 is exposed at the bottom surface of the contact hole 82. Moreover, the body region 64 is exposed to the bottom surface of the contact hole 82 at a position not shown.

A contact plug 86 is disposed inside each contact hole 82. The contact plugs 86 are made of a metal, and in contact with the upper surface 12a of the semiconductor substrate 12. The contact plugs 86 are connected to the emitter regions 60. Moreover, the contact plugs 86 are connected to the body region 64 at a position not shown. Each contact plug 86 has a barrier metal 28 and a filling metal layer 94.

The barrier metal 28 covers an inner surface of each contact hole (i.e., the upper surface 12a of the semiconductor substrate 12 that configures the bottom surface of the contact hole 82, and a lateral surface of the interlayer insulating film 80).

The filling metal layer 94 is provided on each barrier metal 28. In the present embodiment, the filling metal layers 94 are made of tungsten or copper.

An emitter electrode 56 is provided on the interlayer insulating film 80 and the contact plugs 86. The emitter electrode 56 extends on and astride the interlayer insulating film 80 and the contact plugs 86. The emitter electrode 56 is made of AlSi. The emitter electrode 56 is connected to the emitter regions 60 and the body region 64 via the contact plugs 86. The emitter electrode 56 is insulated from the gate electrodes 74 by the interlayer insulating film 80.

A polyimide film 34 is provided in a range on the interlayer insulating film 80 where the emitter electrode 56 is not provided. The polyimide film 34 also covers an end portion of the emitter electrode 56.

A collector electrode 58 is provided on the lower surface 12b of the semiconductor substrate 12. The collector electrode 58 is connected to the collector region 68 with a low resistance.

Figure 2:
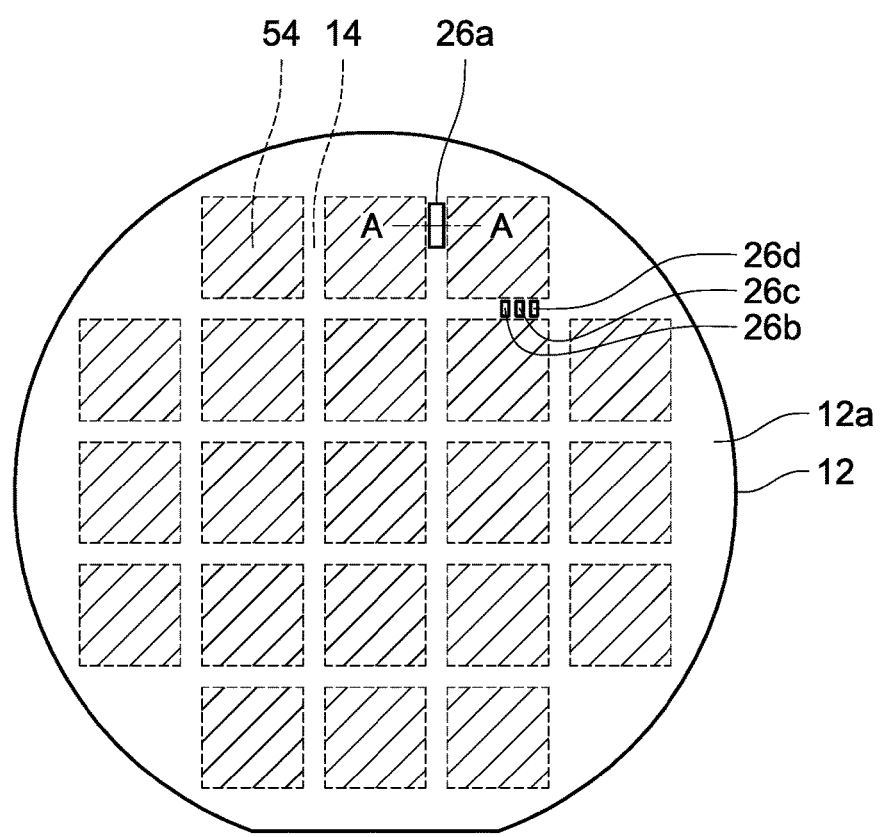
FIG. 2 shows a plan view of a semiconductor substrate 12 before processing.

Next, a method for manufacturing the semiconductor device 10 will be described. The semiconductor device 10 is manufactured from the semiconductor substrate 12 before processing shown in FIG. 2. Although not shown, a plurality of alignment marks is provided on the upper surface 12a of the semiconductor substrate 12 before processing. Moreover, although FIG. 2 shows alignment holes 26a, 26b, 26c, and 26d for description, the alignment holes 26a, 26b, 26c, and 26d are not yet formed in the semiconductor substrate 12 before processing. As described in details later, the alignment holes 26a, 26b, 26c, and 26d are formed at some point during a course of the manufacturing process.

The semiconductor substrate 12 before processing is made of an n-type semiconductor, an entirety of which has a same n-type impurity concentration as the drift region 66. A large number of semiconductor devices 10 will be manufactured in the semiconductor substrate 12. Parts 54 hatched with diagonal lines in FIG. 2 each serves as an element portion 54 where a semiconductor device 10 is to be formed. Moreover, a part 14 interposed between two adjacent ones of the element portions 54 in FIG. 2 serves as a dicing portion 14 to be cut in a subsequent dicing step.

Figure 3:
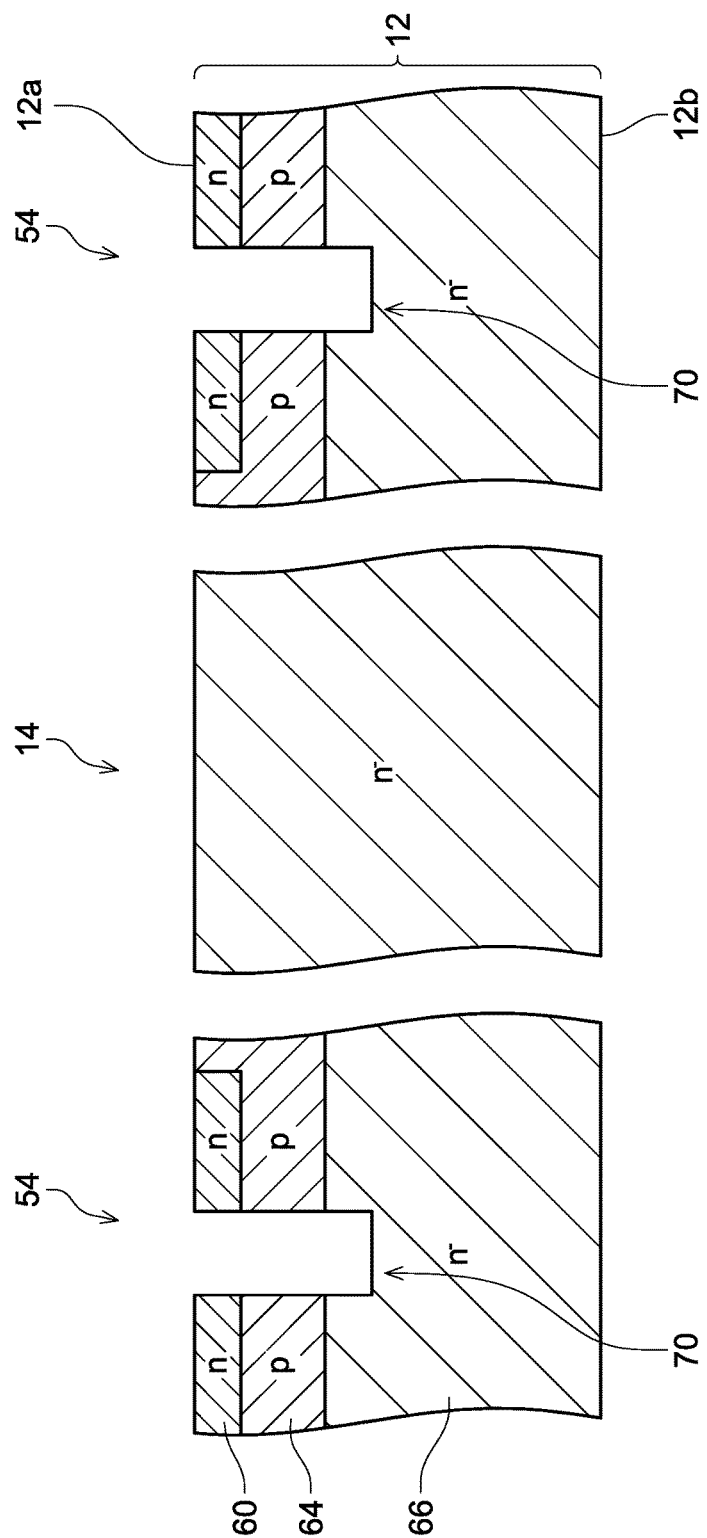
FIG. 3 shows a vertical cross-sectional view of the semiconductor substrate 12 in a manufacturing step to vertical cross-sectional view on a line A-A in FIG. 2)

Initially, as shown in FIG. 3, the emitter regions 60 and the body region 64 are formed in the element portions 54 by ion implantation. Next, the trenches 70 are formed by anisotropic etching. The emitter regions 60, the body region 64, and the trenches 70 are formed by being aligned with reference to the alignment marks formed on the upper surface 12a of the semiconductor substrate 12.

Figure 4:
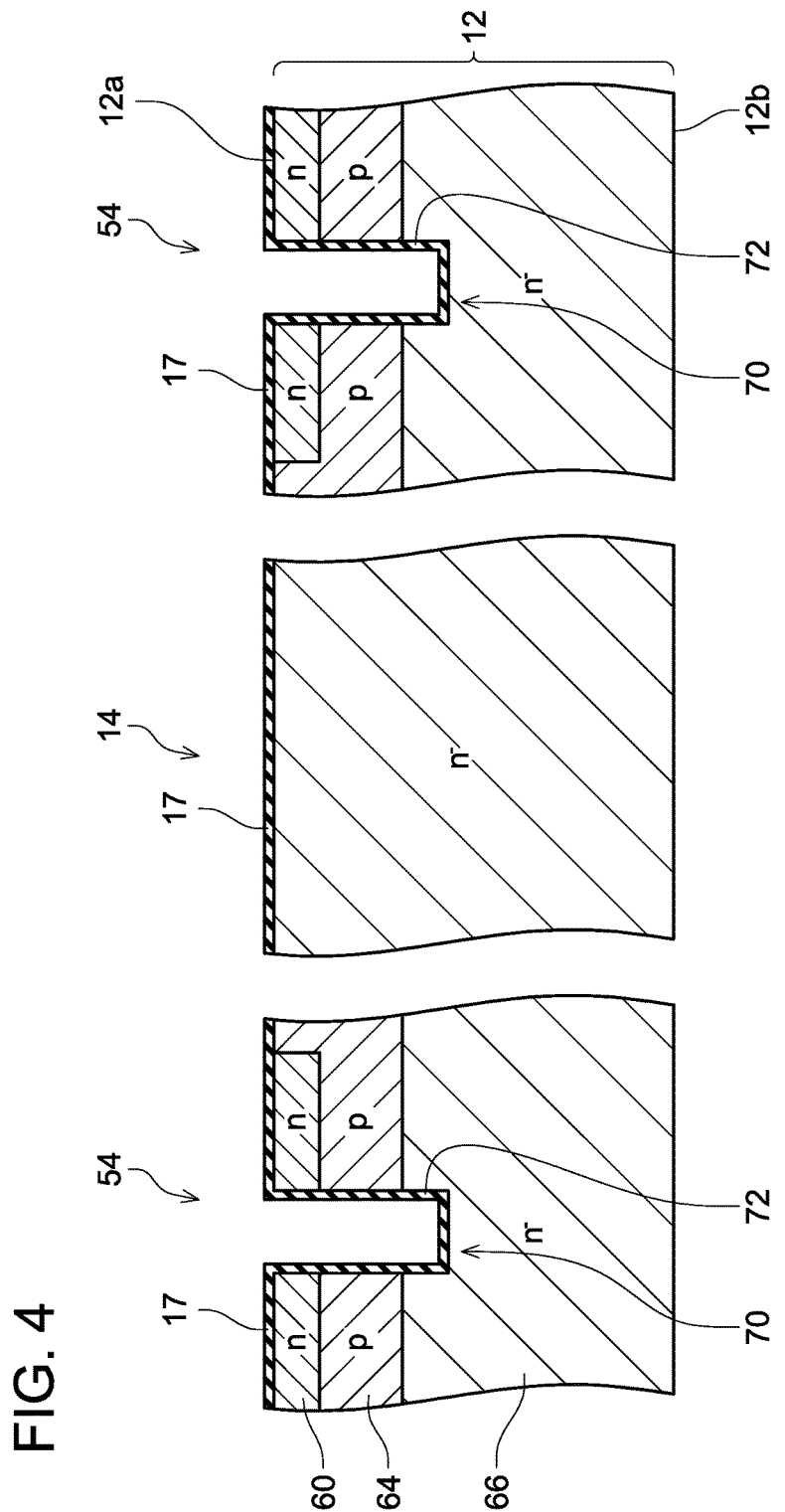
FIG. 4 shows a vertical cross-sectional view of the semiconductor substrate 12 in the manufacturing step.

Next, as shown in FIG. 4, the upper surface 12a of the semiconductor substrate 12 is oxidized to thereby form a gate insulating film 72 and a surface oxide film 17. The surface oxide film 17 is formed in the element portions 54 and the dicing portion 14.

Figure 5:
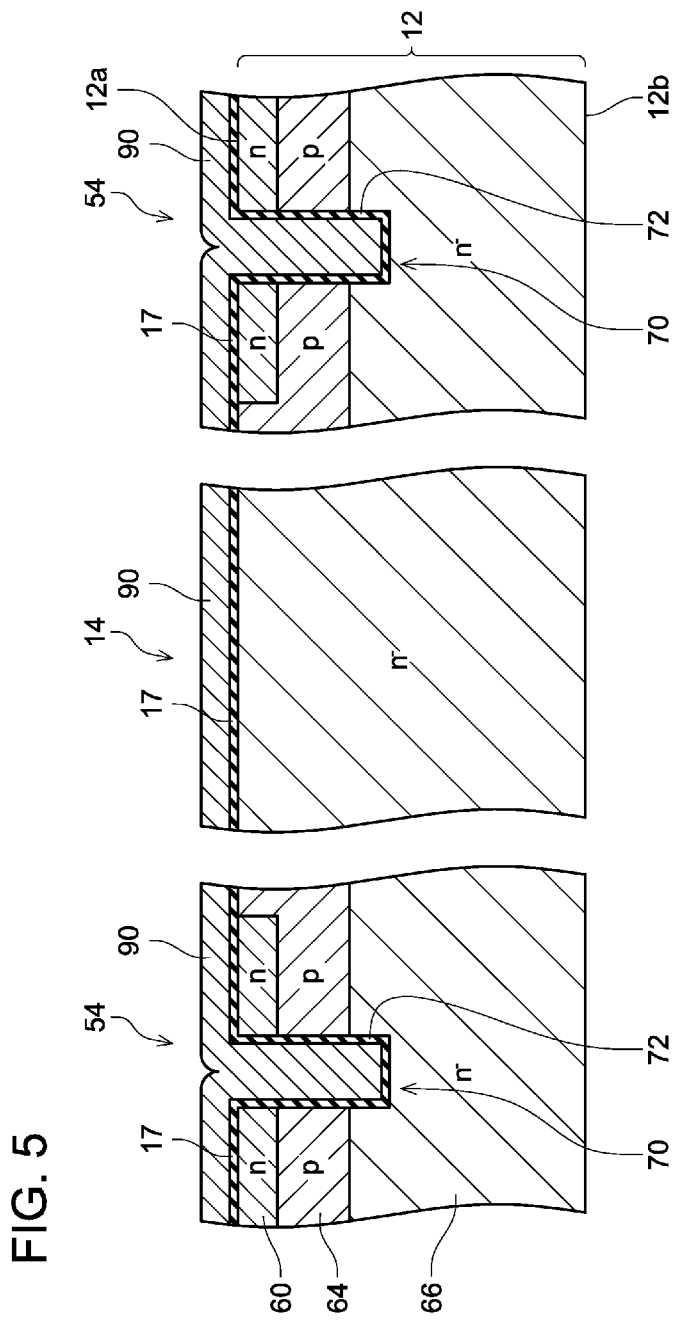
FIG. 5 shows a vertical cross-sectional view of the semiconductor substrate 12 in the manufacturing step.
Figure 6:
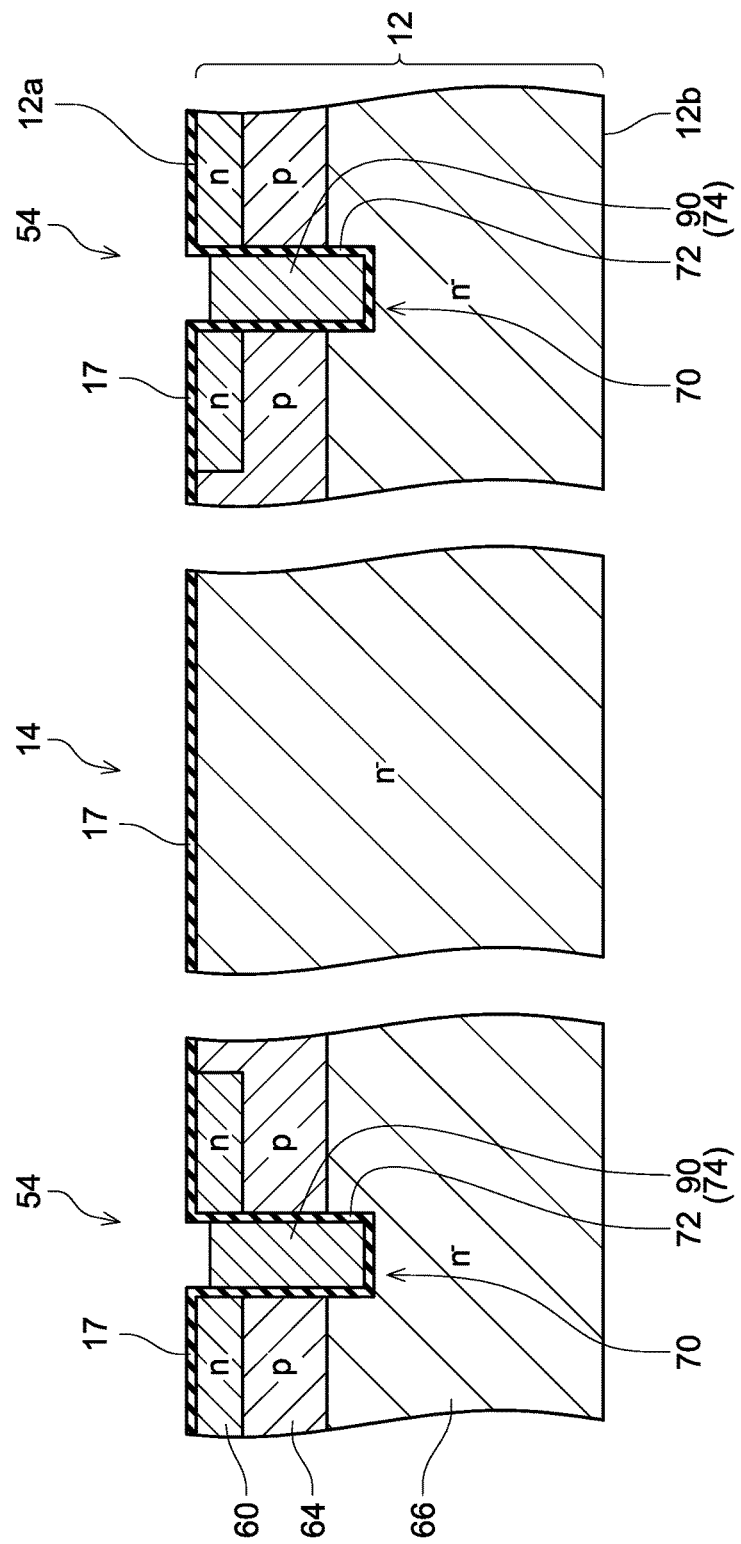
FIG. 6 shows a vertical cross-sectional view of the semiconductor substrate 12 in the manufacturing step.

Next, as shown in FIG. 5, a polysilicon layer 90 is grown on the surface of the substrate. The trenches 70 are filled with the polysilicon layer 90 without a gap. Moreover, the polysilicon layer 90 is formed on the surface oxide film 17. Next, the polysilicon layer 90 is etched. Here, as shown in FIG. 6, the polysilicon layer 90 on the surface oxide film 17 is removed, while the polysilicon layer 90 is allowed to remain in the trenches 70. The polysilicon layer 90 thus remaining in each trench 70 serves as the gate electrode 74. Moreover, a part of the polysilicon layer 90 is allowed to remain in a range on the surface oxide film 17 not shown. The part of the polysilicon layer 90 thus remaining on the surface oxide film 17 functions as a gate wiring linked to the gate electrodes 74. The gate wiring is shaped, by etching, into a shape that protrudes upward from the surface oxide film 17 in its cross section.

Figure 7:
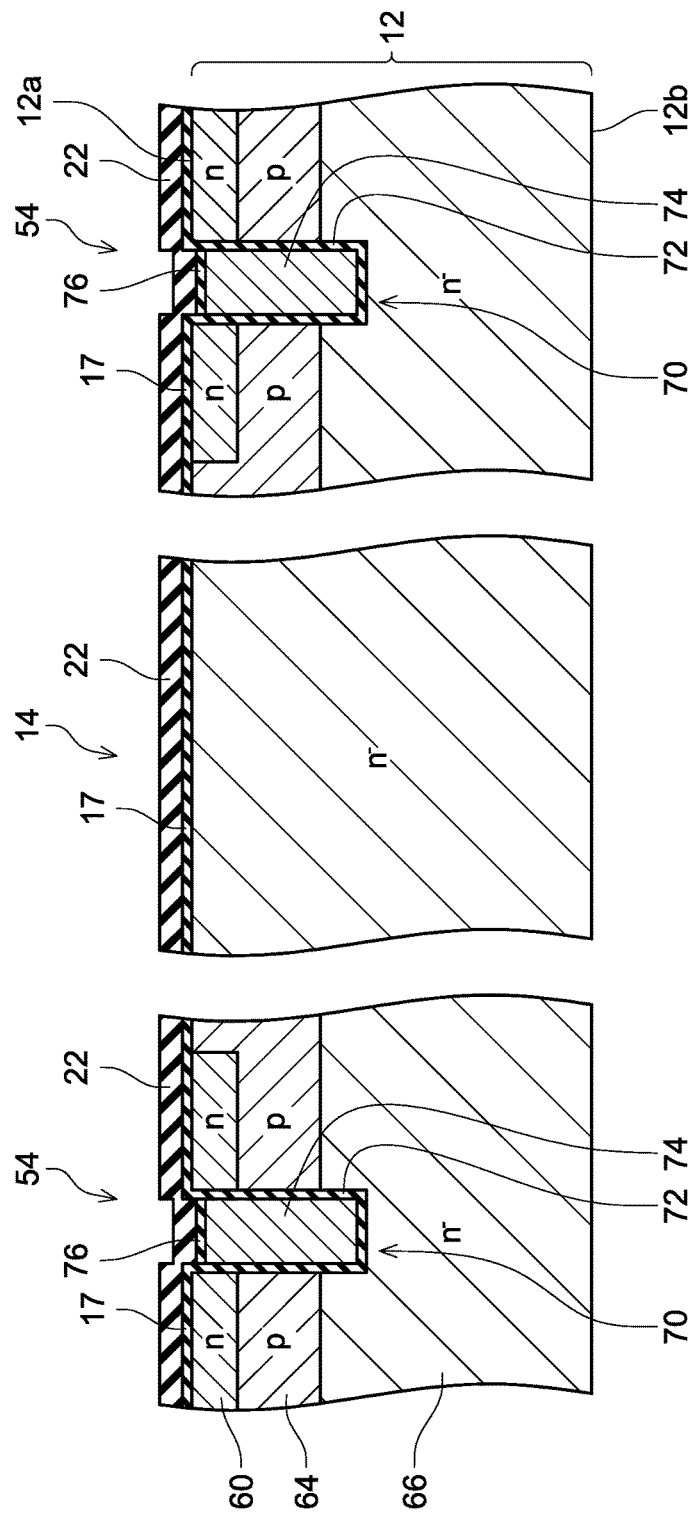
FIG. 7 shows a vertical cross-sectional view of the semiconductor substrate 12 in the manufacturing step.

Next, as shown in FIG. 7, the upper surfaces of the gate electrodes 74 are oxidized to thereby form the cap insulating films 76.

Next, as shown in FIG. 7, an NSG film 22 is grown by CVD on the cap insulating films 76 and the surface oxide film 17. The NSG film 22 covers the cap insulating films 76 and the surface oxide film 17.

Figure 8:
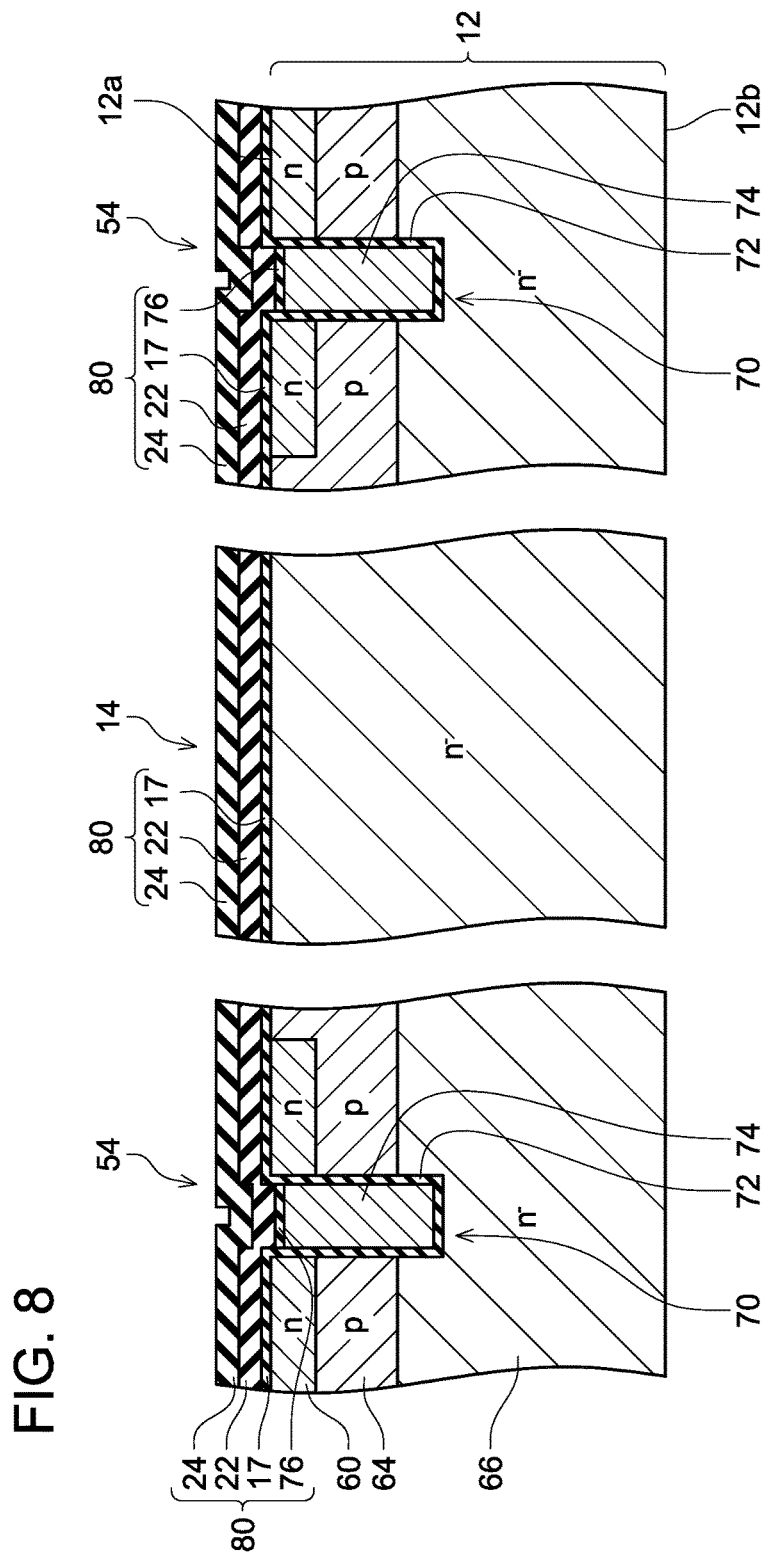
FIG. 8 shows a vertical cross-sectional view of the semiconductor substrate 12 in the manufacturing step.

Next, as shown in FIG. 8, a BPSG film 24 is grown by CVD on the NSG film 22. By forming the BPSG film 24, the interlayer insulating film 80 is completed. As shown in FIG. 8, the interlayer insulating film 80 is formed astride the element portions 54 and the dicing portion 14. Notably, upon the BPSG film 24 being formed, the NSG film 22 prevents boron and phosphorus in the BPSG film 24 from being diffused into the semiconductor substrate 12. As such, by initially forming the NSG film 22, and then forming the BPSG film 24, boron and phosphorus can be prevented from being diffused from the BPSG film 24 into the semiconductor substrate 12.

Figure 9:
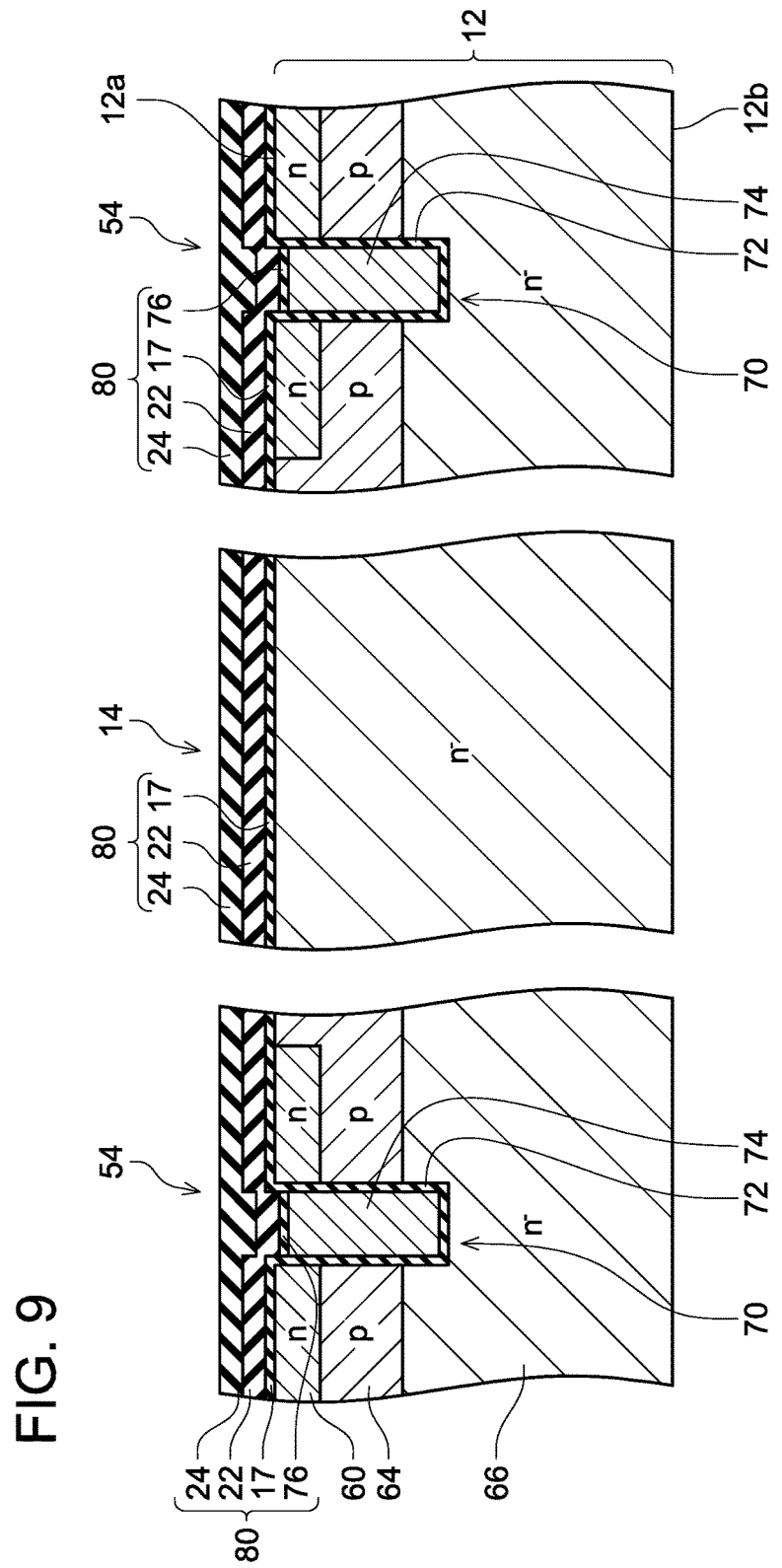
FIG. 9 shows a vertical cross-sectional view of the semiconductor substrate 12 in the manufacturing step.

Next, the semiconductor substrate 12 is thermally treated. During the thermal treatment, the BPSG film 24 is fluidized to planarize an upper surface of the BPSG film 24. Accordingly, as shown in FIG. 9, the upper surface of the BPSG film 24 becomes flatter after the thermal treatment, when compared to the upper surface before the thermal treatment. Notably, the NSG film 22 and the BPSG film 24 are formed to cover the above-mentioned gate wiring. As mentioned above, the gate wiring has the shape that protrudes upward from the surface oxide film 17. Accordingly, even after the planarizing, there exists, above the gate wiring, a convex portion that protrudes upward on the upper surface of the BPSG film 24.

Figure 10:
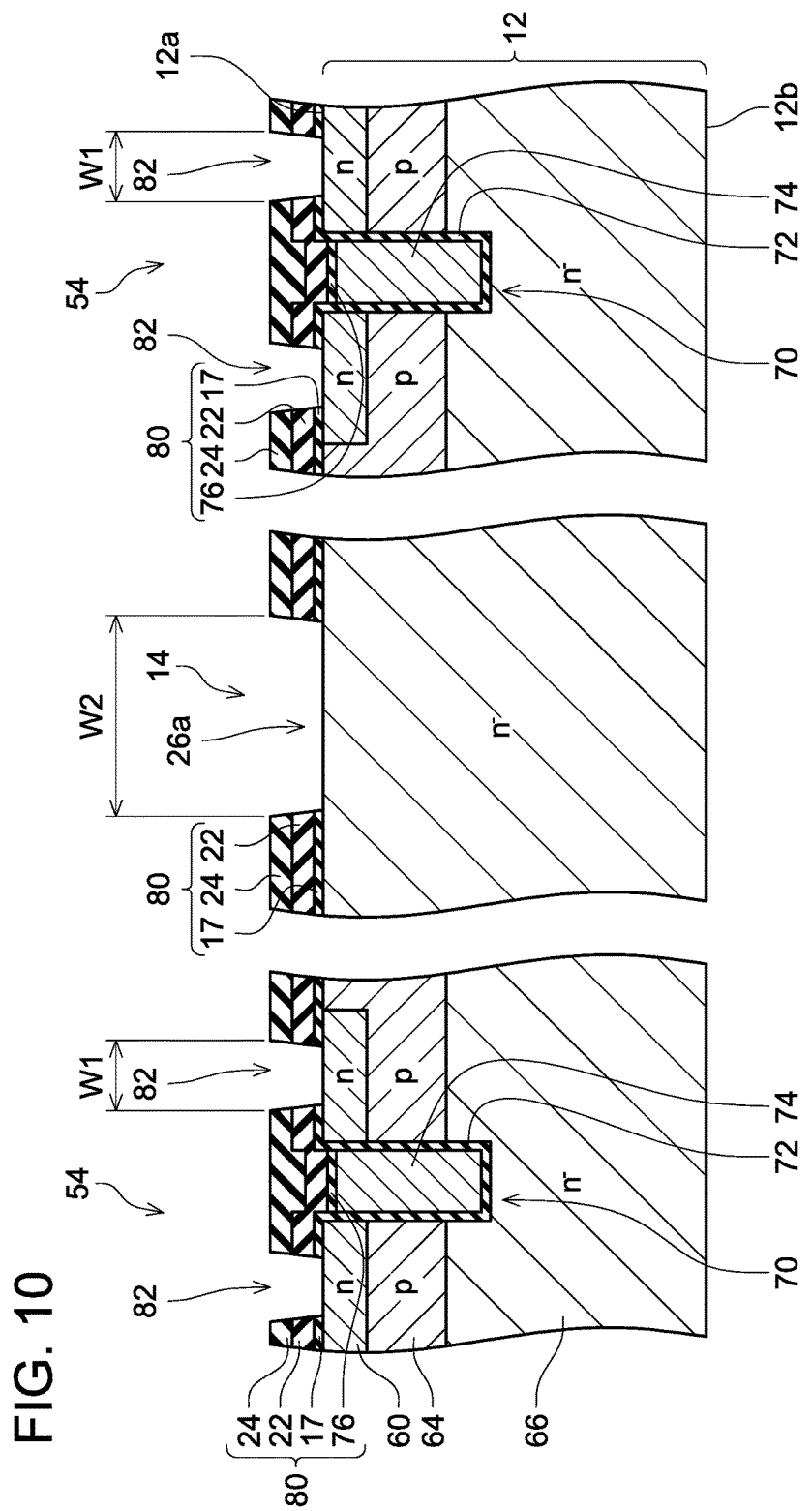
FIG. 10 shows a vertical cross-sectional view of the semiconductor substrate 12 in the manufacturing step.

Next, as shown in FIG. 10, the interlayer insulating film 80 is selectively etched to thereby form the contact holes 82 and the alignment hole 26 (26a). Notably, the contact holes 82 and the alignment hole 26 are formed by being aligned with reference to the convex portion of the BPSG film 24 existing above the gate wiring (not shown as mentioned above).

A plurality of the contact holes 82 is formed in each element portion 54. Each contact hole 82 is formed at a position where a gate electrode 74 is not provided. The contact holes 82 are formed to penetrate the interlayer insulating film 80. Accordingly, the upper surface 12a of the semiconductor substrate 12 is exposed at the bottom surface of each contact hole 82. Here, each contact hole 82 is formed to have a width W1.

As shown in FIG. 2, the alignment holes 26 are formed in the dicing portion 14. The alignment hole 26a in FIG. 2 extends long along a longitudinal direction of the dicing portion 14. Moreover, each of the alignment holes 26b, 26c, and 26d in FIG. 2 extends long along a direction orthogonal to the longitudinal direction of the dicing portion 14. As such, alignment holes 26 that have various shapes can be formed in the dicing portion 14. Notably, cross-sectional structures of the alignment holes 26a, 26b, 26c, and 26d are approximately the same, and hence the cross-sectional structure of the alignment hole 26a is taken as an example for description, in the description below.

As shown in FIG. 10, the alignment hole 26a is formed to penetrate the interlayer insulating film 80. Accordingly, the upper surface 12a of the semiconductor substrate 12 is exposed at a bottom surface of the alignment hole 26a. Here, the alignment hole 26a is formed to have a width W2. The width W2 of the alignment hole 26a is wider than the width W1 of the contact hole 82. In other words, the width W2 of the alignment hole 26a is wider than the width of any of the contact holes 82. For example, the width W2 of the alignment hole 26a can be set to 4 μm or more.

Figure 11:
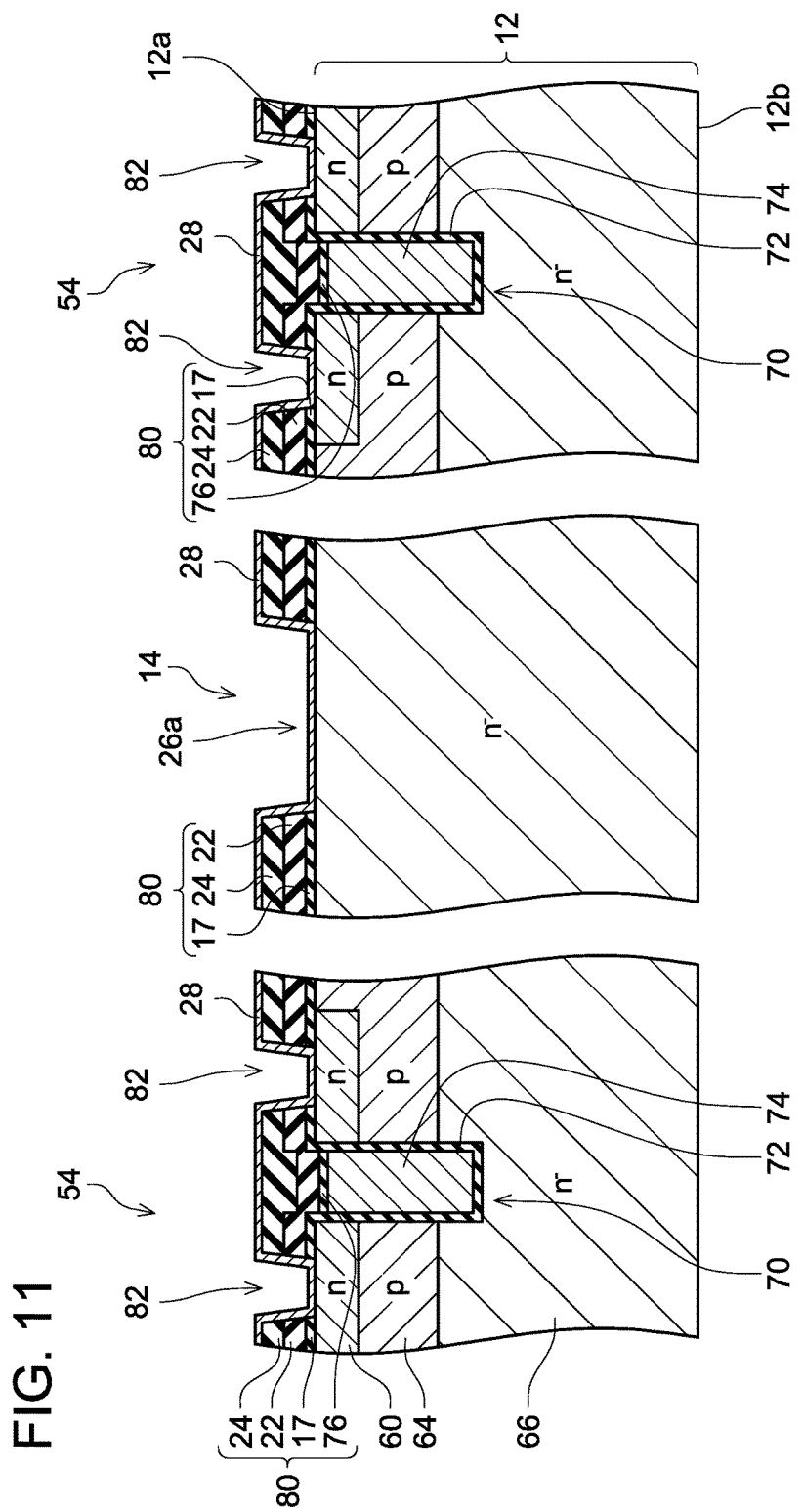
FIG. 11 shows a vertical cross-sectional view of the semiconductor substrate 12 in the manufacturing step.

Next, as shown in FIG. 11, a barrier metal 28 is formed on the surface of the substrate. The barrier metal 28 is formed to cover the inner surfaces of the contact holes 82, an inner surface of the alignment hole 26, and the upper surface of the BPSG film 24.

Figure 12:
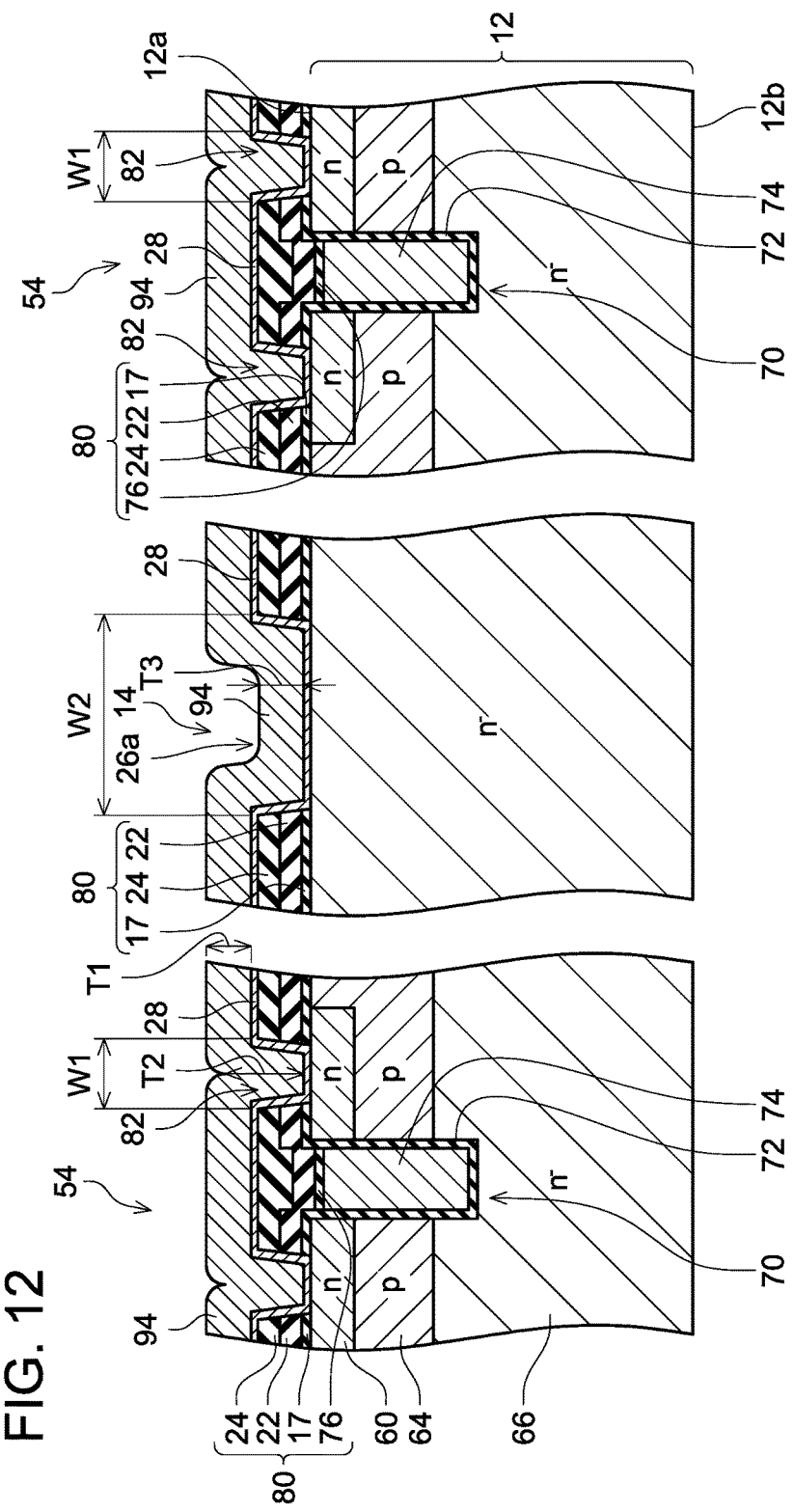
FIG. 12 shows a vertical cross-sectional view of the semiconductor substrate 12 in the manufacturing step.

Next, as shown in FIG. 12, filling metal layer 94 is grown by a CVD method on the surface of the substrate (a surface of the barrier metal 28). The filling metal layer 94 is made of a metal that can be grown by a CVD method. For example, tungsten or copper can be used as the filling metal layer 94. The filling metal layer 94 is grown on the inner surfaces of the contact holes 82, the inner surface of the alignment hole 26, and above the BPSG film 24. Here, the filling metal layer 94 is grown so that a thickness of the filling metal layer 94 is thicker than a half of the width W1 of the contact holes 82, and thinner than a half of the width W2 of the alignment hole 26.

The filling metal layer 94 is grown in the contact holes 82 at the bottom surface and both lateral surfaces of each contact hole 82. The filling metal layer 94 is grown to be thicker than a half of the width W1 of the contact hole 82, and hence portions of the filling metal layer 94 grown on both lateral surfaces of the contact hole 82, respectively, are connected at a central portion of the contact hole 82. Accordingly, the filling metal layer 94 is grown in each contact hole 82 without a gap. Accordingly, a thickness 12 of the filling metal layer 94 on the bottom surface of the contact hole 82 is thicker than a thickness T1 of the filling metal layer 94 above the interlayer insulating film 80.

On the other hand, the filling metal layer 94 is grown in the alignment hole 26 at the bottom surface and both lateral surfaces of the alignment hole 26. The filling metal layer 94 is grown to be thinner than a half of the width W2 of the alignment hole 26, and hence portions of the filling metal layer 94 grown on both lateral surfaces of the alignment hole 26, respectively, are not connected to each other. Accordingly, in the alignment hole 26, the filling metal layer 94 is grown to have a uniform thickness along the inner surface of the alignment hole 26. Accordingly, a thickness T3 of the filling metal layer 94 on the bottom surface of the alignment hole 26 is approximately equal to the thickness 11 of the filling metal layer 94 above the interlayer insulating film 80.

Accordingly, the thickness T3 of the filling metal layer 94 on the bottom surface of the alignment hole 26 becomes thinner than the thickness 12 of the filling metal layer 94 on the bottom surfaces of the contact holes 82.

Notably, upon forming the filling metal layer 94, the barrier metal 28 prevents a metallic element that forms the filling metal layer 94 (i.e., tungsten or copper) from being diffused into the semiconductor substrate 12. Generation of defects and the like is thereby prevented in the contact portions of the semiconductor substrate 12.

Figure 13:
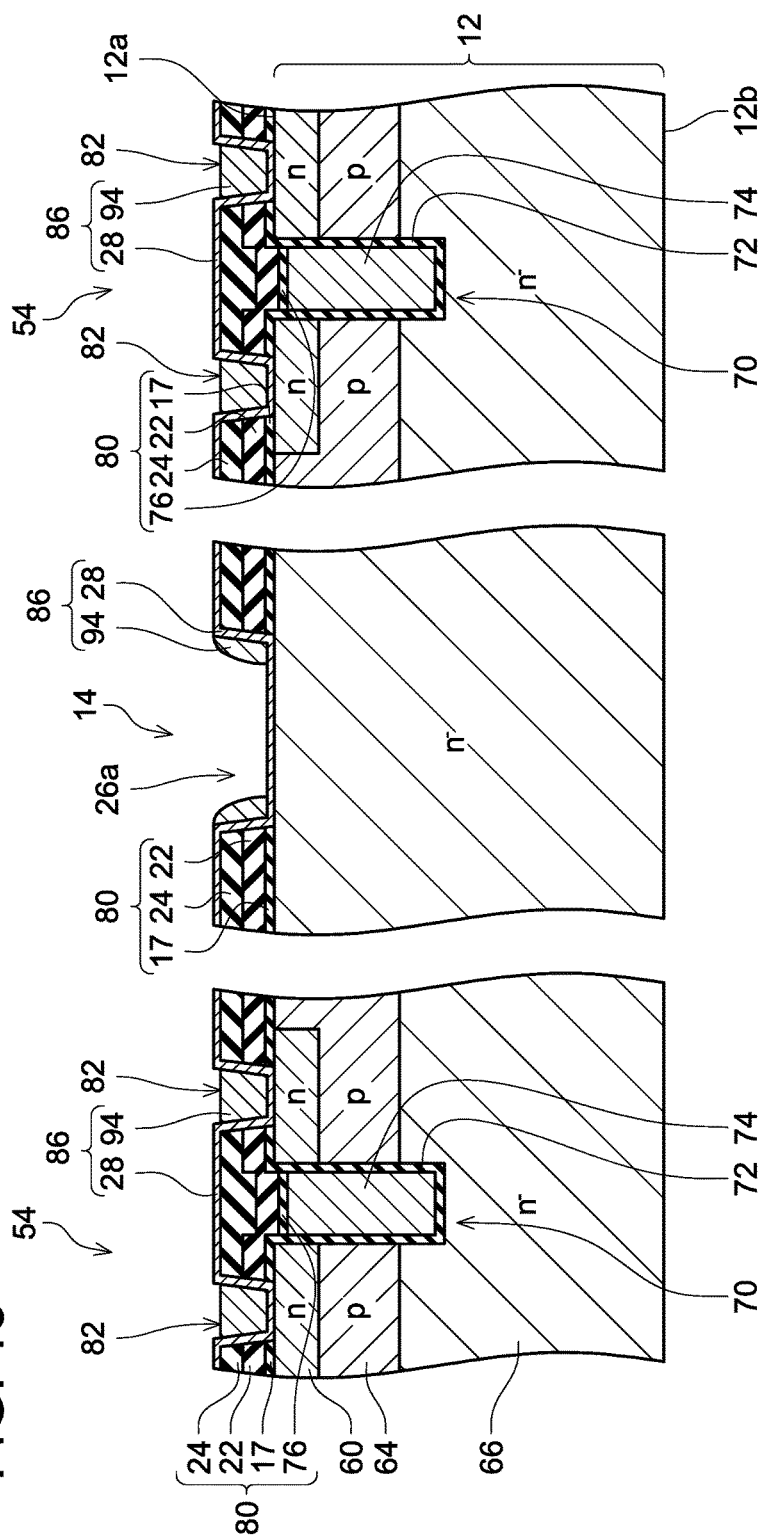
FIG. 13 shows a vertical cross-sectional view of the semiconductor substrate 12 in the manufacturing step.

Next, as shown in FIG. 13, the filling metal layer 94 is etched. Here, the filling metal layer 94 above the interlayer insulating film 80 is removed, whereas the filling metal layer 94 is allowed to remain in the contact holes 82. More specifically, the etching is performed so that an upper surface of the filling metal layer 94 that remains in the contact holes 82 approximately coincides with the upper surface of the interlayer insulating film 80. Moreover, the filling metal layer 94 in the alignment hole 26 is also etched. As mentioned above, the thickness of the filling metal layer 94 in the alignment hole 26 is approximately equal to the thickness of the filling metal layer 94 above the interlayer insulating film 80. Accordingly, most part of the filling metal layer 94 in the alignment hole 26 is removed, and the barrier metal 28 is exposed in the alignment hole 26. However, an etching agent is difficult to reach a proximity of a corner between the bottom surface and the lateral surface of the alignment hole 26, and hence the etching speed is decreased in the proximity of the corner. Accordingly, the filling metal layer 94 remains covering the corner of the alignment hole 26.

Figure 14:
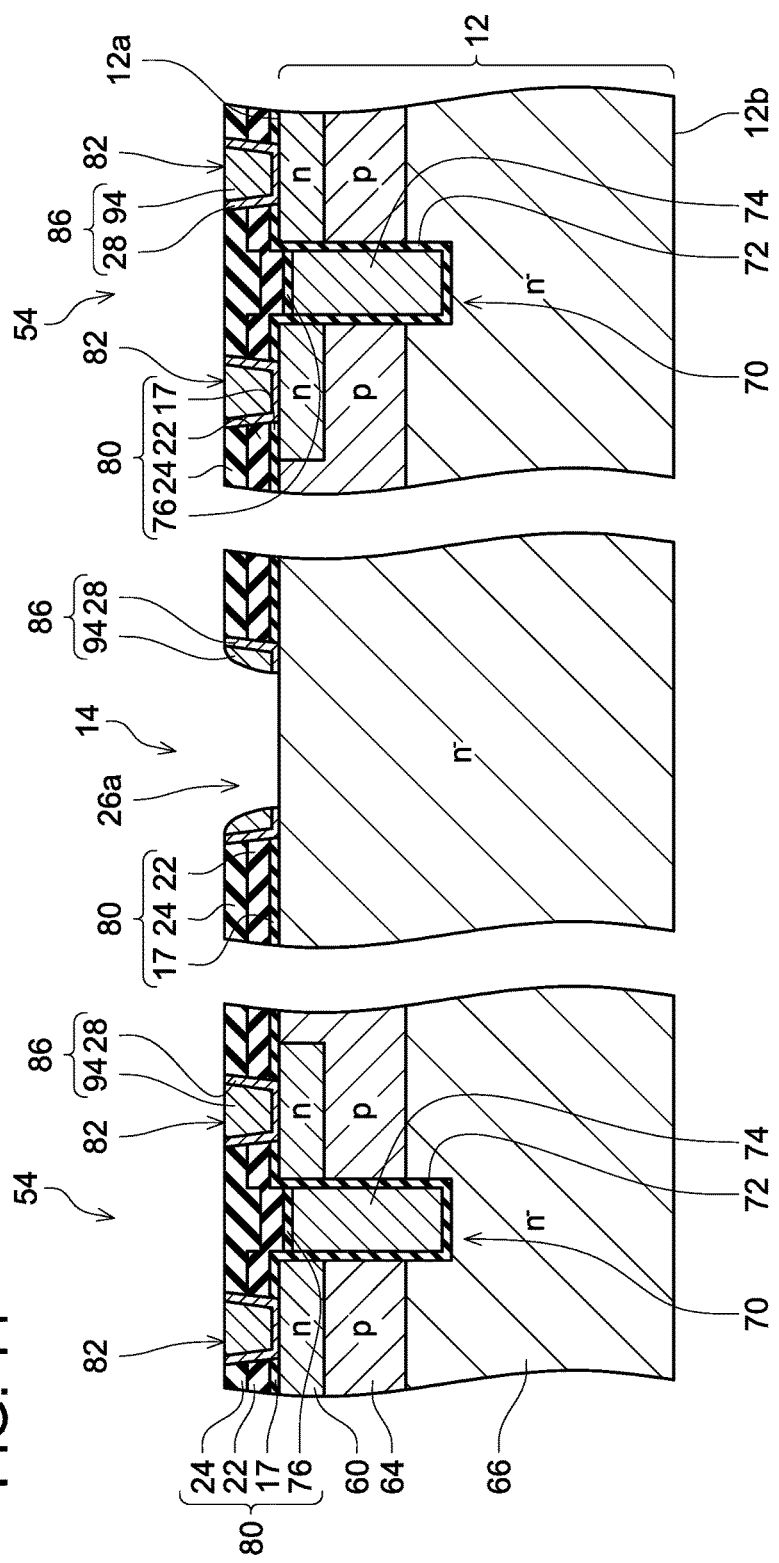
FIG. 14 shows a vertical cross-sectional view of the semiconductor substrate 12 in the manufacturing step.

Next, as shown in FIG. 14, the barrier metal 28 at the exposed part is etched. Here, the barrier metal 28 above the interlayer insulating film 80 is removed. The upper surface of the BPSG film 24 is thereby exposed. The barrier metals 28 in the contact holes 82 are covered with the filling metal layer 94, and hence are not etched. Accordingly, the barrier metals 28 remain in the contact holes 82. In other words, the bottom surface of each contact hole 82 is maintained in a state of being covered with the barrier metal 28 and the filling metal layer 94, and the bottom surface of the contact hole 82 is not exposed. The filling metal layer 94 and the barrier metal 28 that remain in each contact hole 82 serve as the contact plug 86. Moreover, the barrier metal 28 under the filling metal layer 94 at the corner of the alignment hole 26 is not etched, either. The barrier metal 28 in a range in the alignment hole 26 that is not covered with the filling metal layer 94 is removed. Accordingly, the bottom surface of the alignment hole 26 (i.e., the upper surface 12a of the semiconductor substrate 12) is exposed.

Figure 15:
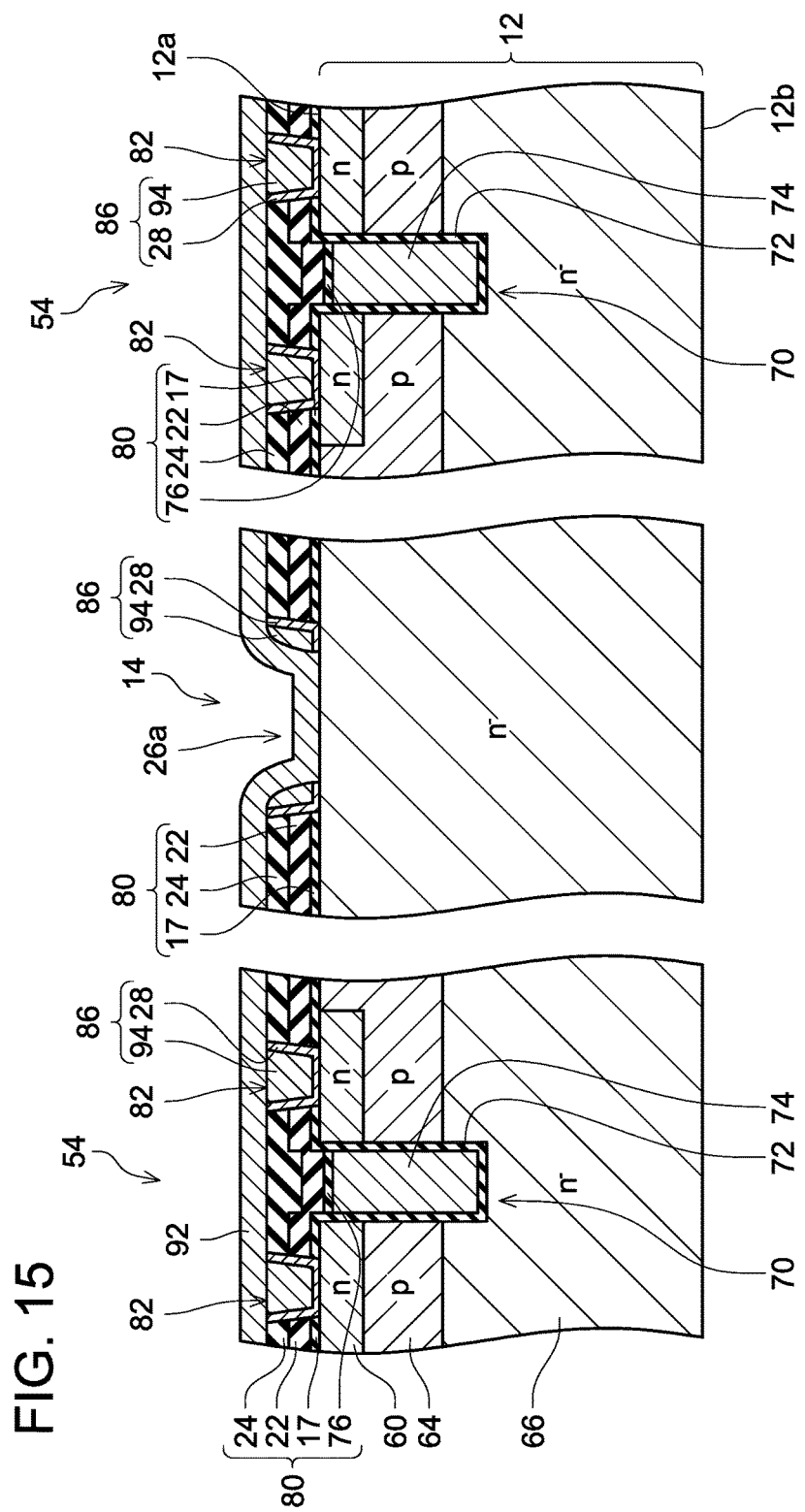
FIG. 15 shows a vertical cross-sectional view of the semiconductor substrate 12 in the manufacturing step.

Next, as shown in FIG. 15, an AlSi layer 92 is grown on the surface of the substrate. Notably, in the present embodiment, the AlSi layer 92 is grown at a low temperature (e.g., at a temperature 200 degrees or lower). When the AlSi layer 92 is grown at a low temperature, nodules of Si become difficult to be precipitated in the AlSi layer 92, and the AlSi layer 92 having a high strength can be formed. Moreover, when the AlSi layer 92 is grown on a surface that has asperities, there may be a case where deep grooves are formed in a surface of the AlSi layer 92. In the case of growing the AlSi layer 92 at a low temperature, in particular, grooves are more easily formed in the surface of the AlSi layer 92. In the present embodiment, a surface of each element portion 54 (i.e., a surface configured with the upper surface of the interlayer insulating film 80 and upper surfaces of the contact plugs 86) is approximately flat. Accordingly, the AlSi layer 92 having a flat surface can be formed on the element portion 54. Grooves are less likely to be formed in the surface of the AlSi layer 92, and hence the AlSi layer 92 having a high strength and durability can be formed.

Moreover, before the formation of the AlSi layer 92, the BPSG film 24 has been exposed. Accordingly, the AlSi layer 92 makes direct contact with the BPSG film 24, resulting in that the AlSi layer 92 is in intimate contact with the BPSG film 24 with a high strength. Therefore, the AlSi layer 92 hardly peels off.

Figure 16:
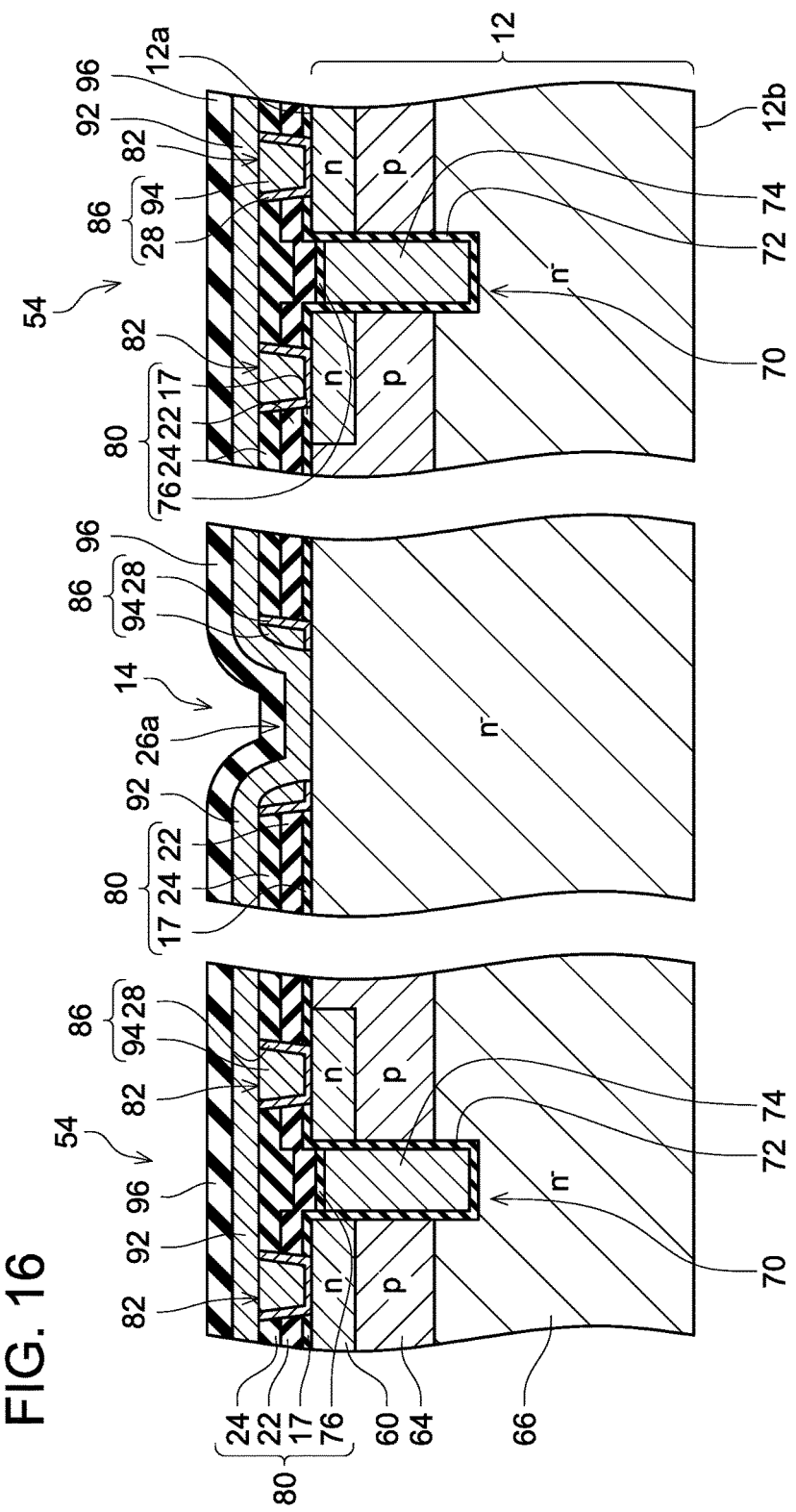
FIG. 16 shows a vertical cross-sectional view of the semiconductor substrate 12 in the manufacturing step.
Figure 17:
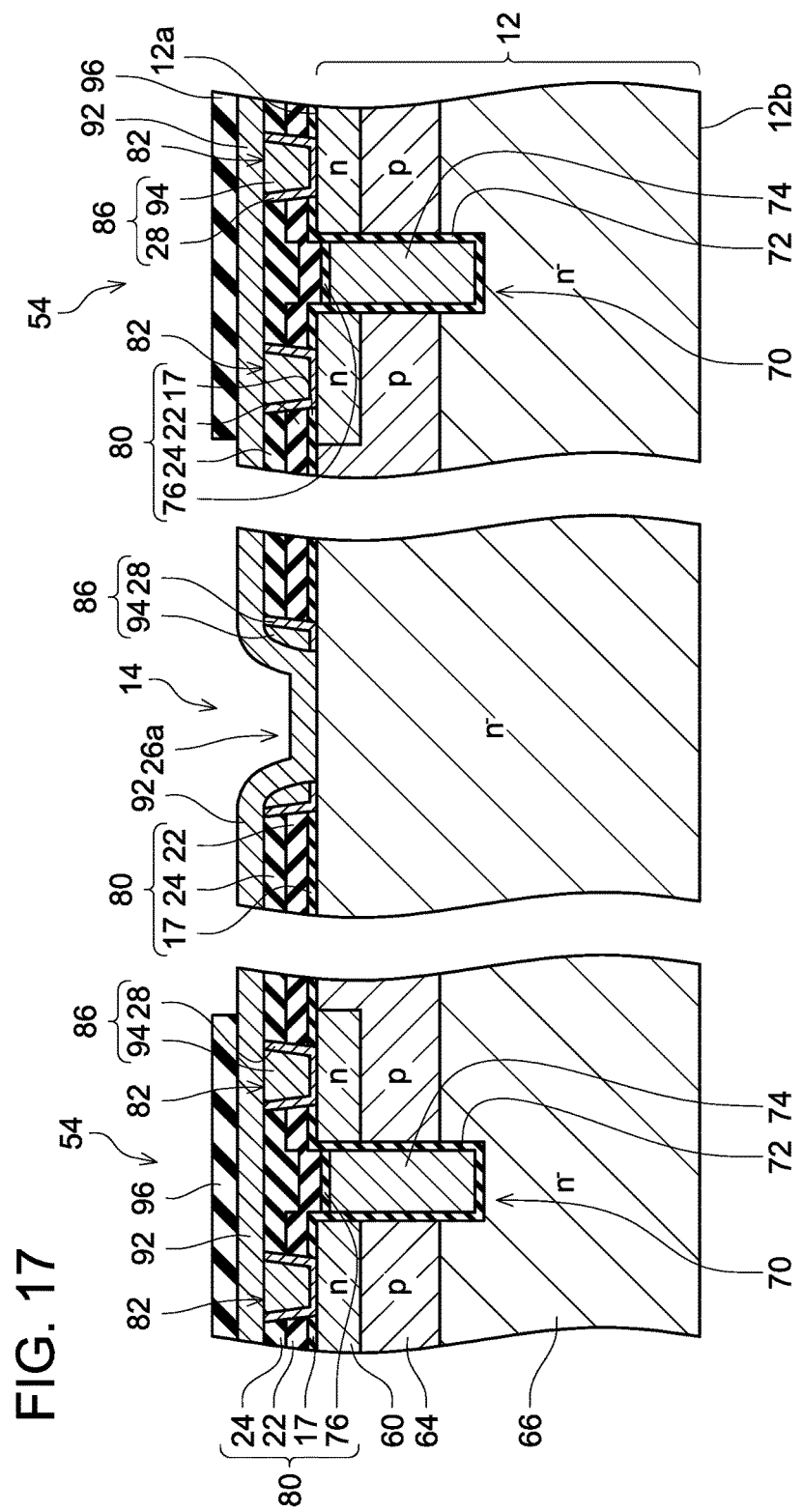
FIG. 17 shows a vertical cross-sectional view of the semiconductor substrate 12 in the manufacturing step.
Figure 18:
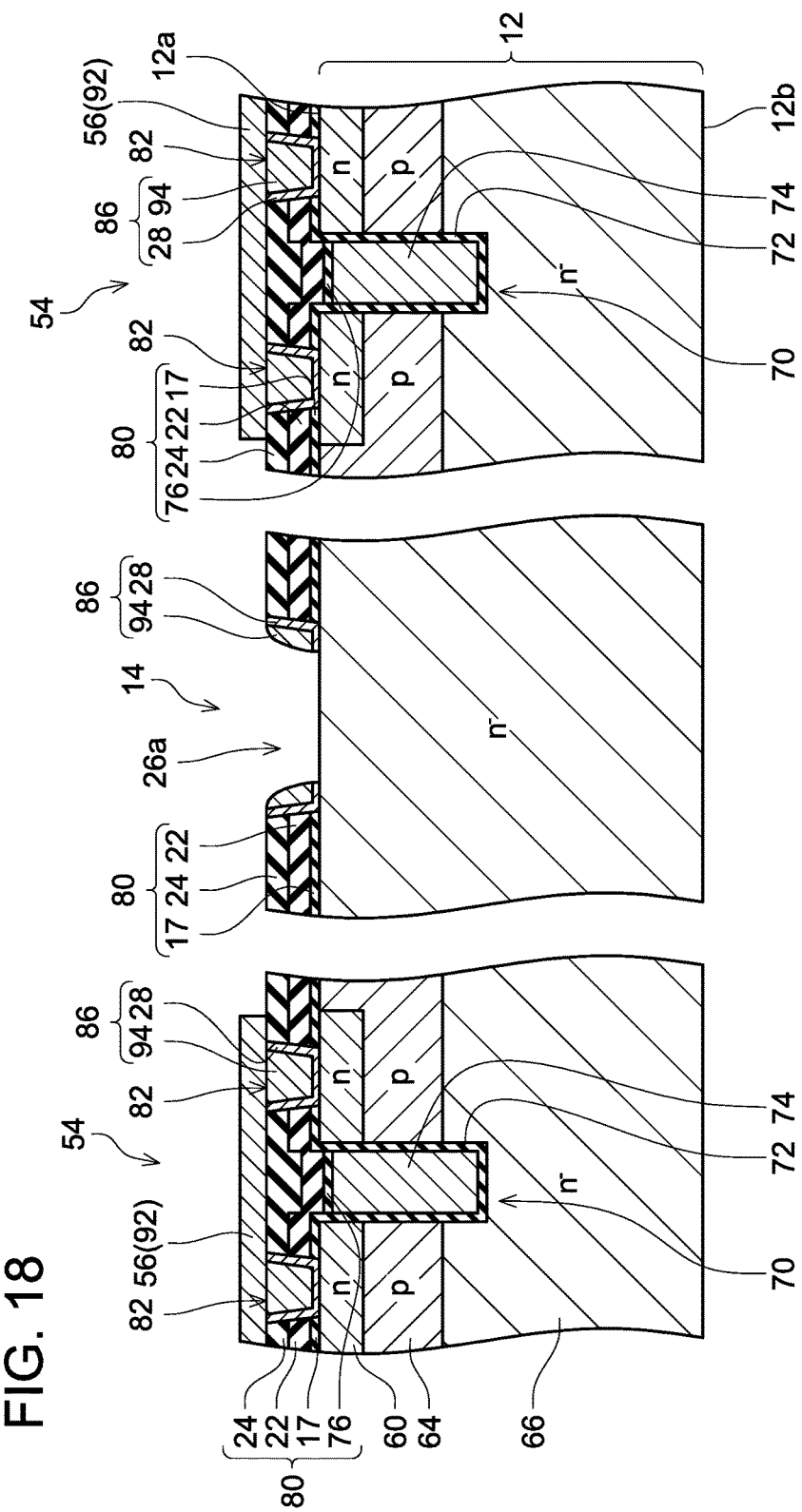
FIG. 18 shows a vertical cross-sectional view of the semiconductor substrate 12 in the manufacturing step.

Next, the AlSi layer 92 is subjected to patterning. Specifically, as shown in FIG. 16, a resist film 96 is initially formed on an entire surface of the AlSi layer 92. Next, image recognition of the alignment hole 26 (more specifically, a concave portion in a surface of the resist film 96, which is provided along the alignment hole 26) is performed to sense a position of the alignment hole 26. Next, while position adjustment is performed based on the sensed position of the alignment hole 26, a pattern is projected onto the resist film 96 by a stepper. A part of the resist film 96 irradiated with light is thereby made insoluble. Next, a part of the resist film 96 that is not made insoluble is removed to thereby subject the resist film 96 to patterning as shown in FIG. 17. Next, the resist film 96 is utilized as a mask to perform etching, to thereby remove a range of the AlSi layer 92 that is not covered with the resist film 96. The AlSi layer 92 in the dicing portion 14 is thereby removed. Thereafter, as shown in FIG. 18, the resist film 96 is removed. The AlSi layer 92 thus remaining as shown in FIG. 18 serves as the emitter electrode 56.

The emitter electrode 56 needs to be formed by being correctly aligned with the contact holes 82. As described above, with the position adjustment by utilizing the alignment hole 26 formed concurrently with the contact holes 82, the emitter electrode 56 can be disposed at a correct position relative to the contact holes 82.

Figure 19:
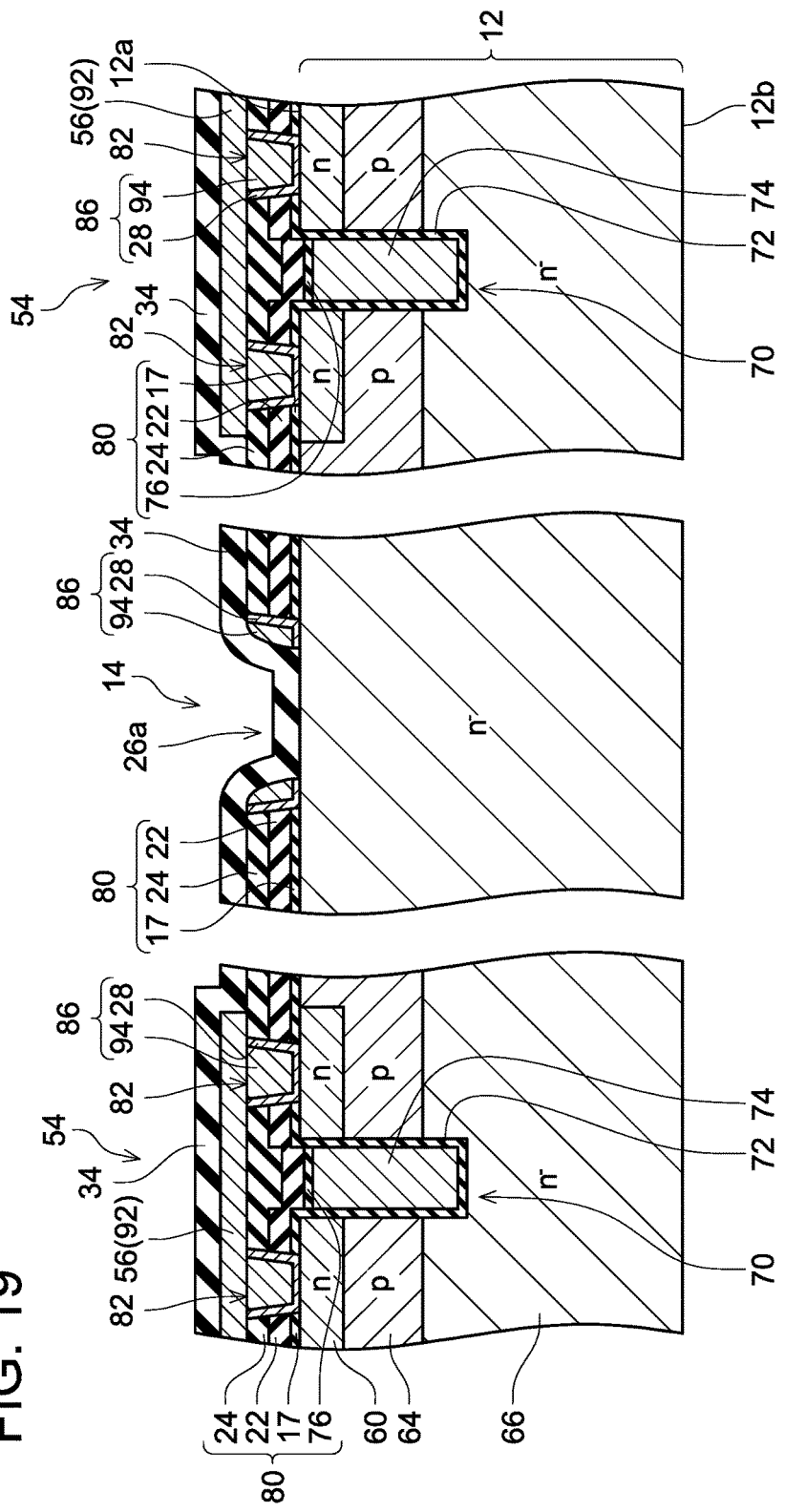
FIG. 19 shows a vertical cross-sectional view of the semiconductor substrate 12 in the manufacturing step.
Figure 20:
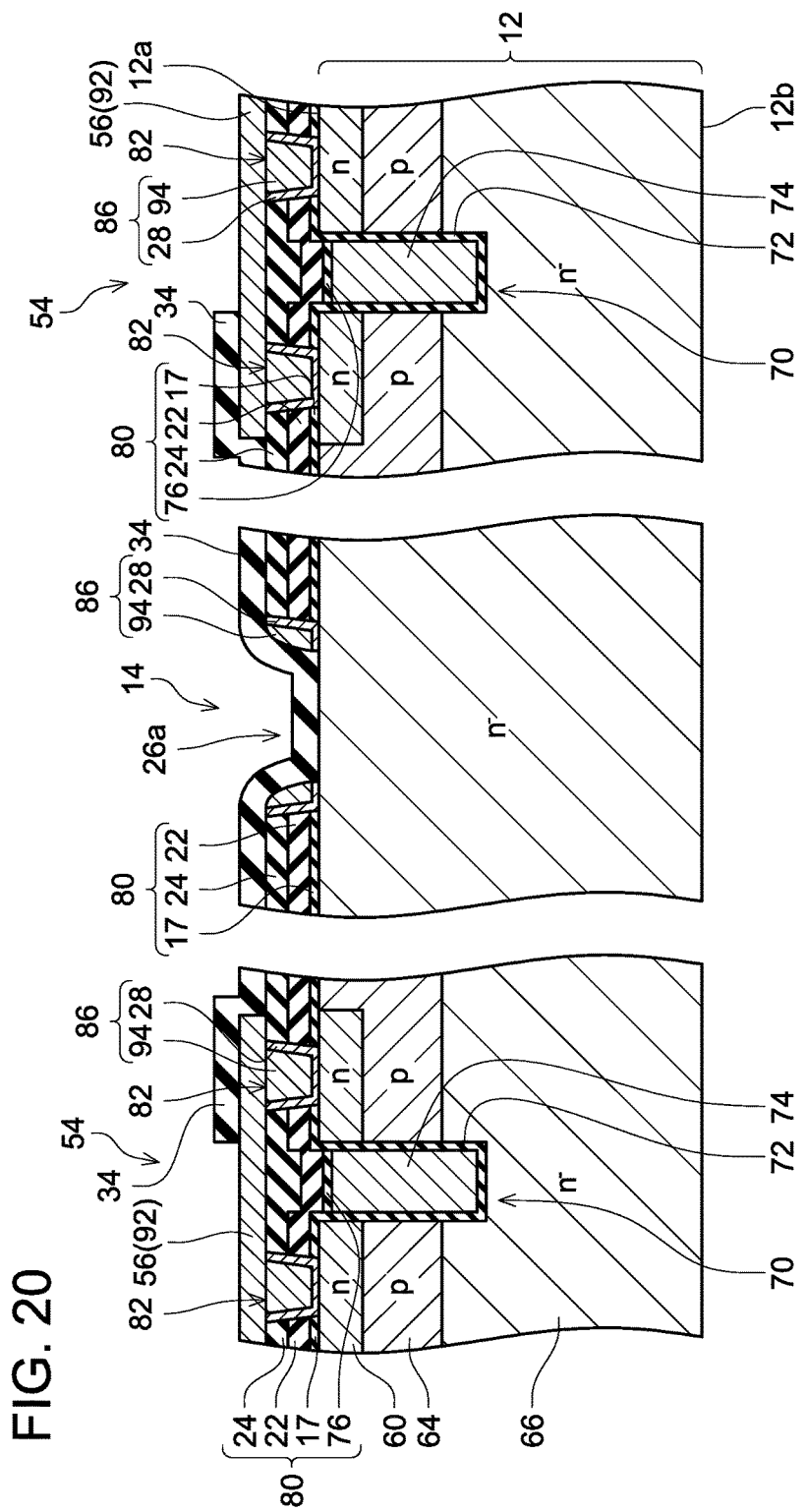
FIG. 20 shows a vertical cross-sectional view of the semiconductor substrate 12 in the manufacturing step.

Next, as shown in FIG. 19, a polyimide film 34 is formed on the entire surface of the substrate. Next, as with the resist film 96 mentioned above, the position of the alignment hole 26 is sensed, and the sensed position is utilized to form a mask subjected to patterning on the polyimide film 34. The polyimide film 34 is then etched via the mask. As shown in FIG. 20, openings are thereby formed in the polyimide film 34 on the emitter electrode 56. As such, by sensing the position of the alignment hole 26, performing position adjustment based on the sensed position, and subjecting the polyimide film 34 to patterning, the polyimide film 34 can correctly be disposed at a designed position.

Next, processing of the semiconductor device 10 on the lower surface 12*b* side is performed to form the collector region 68 and the collector electrode 58. The semiconductor device 10 shown in FIG. 1 is thereby formed in each element portion 54.

Next, the semiconductor substrate 12 is subjected to dicing. More specifically, the dicing portion 14 is cut with a dicing blade to thereby divide the semiconductor substrate 12 into a plurality of the semiconductor devices 10. In other words, the dicing portion 14 where the alignment hole 26 is provided is cut. As mentioned above, since however, most parts of the filling metal layer 94 and the barrier metal 28 have been removed from an inside of the alignment hole 26, and additionally, the AlSi layer 92 has been removed from an inside of the alignment hole 26, even if the dicing portion 14 where the alignment hole 26 is provided is cut, cutting chips attributable to a metal in the alignment hole 26 are seldom generated. Accordingly, in the dicing step, the generation of metal cutting chips is suppressed. Particularly in the conventional manufacturing method, the filling metal layer 94 needs to remain in the contact holes 82, and hence it is difficult to remove the filling metal layer 94 in the alignment hole 26 by etching. In this manufacturing method, however, by making the width W2 of the alignment hole 26 wider than the width W1 of the contact holes 82, the most part of the filling metal layer 94 in the alignment hole 26 can be removed while the filling metal layer 94 is allowed to remain in the contact holes 82. The generation of cutting chips attributable to the filling metal layer 94 in the alignment hole 26 can thereby be suppressed. Accordingly, damages to a surface of the semiconductor device 10 by metal cutting chips are suppressed, and a manufacturing yield of the semiconductor devices 10 is improved.

Moreover, if the filling metal layer 94 is cut in the case where the filling metal layer 94 is made of tungsten, hard cutting chips of tungsten are generated, which damages the surface of the semiconductor device 10 more easily. According to the method in the present embodiment, however, even in the case where the filling metal layer 94 is made of tungsten, the most part of the filling metal layer 94 can be removed from the alignment hole 26, and hence generation of cutting chips of tungsten can be suppressed. Accordingly, the damages to the semiconductor device 10 can be suppressed.

Moreover, in this manufacturing method, the generation of metal cutting chips can be suppressed at the upper surface 12*a*, and hence damages to the structure on the upper surface 12*a* side of the semiconductor device 10 (complicated structure having the contact holes and the like) can be suppressed. Accordingly, a manufacturing yield of the semiconductor devices 10 can more effectively be improved.

Moreover, in this manufacturing method, in the step of etching (removing) the filling metal layer 94 and the barrier metal 28 that are above the interlayer insulating film 80, the most parts of the filling metal layer 94 and the barrier metal 28 in the alignment hole 26 are removed. Accordingly, there is no need to arrange a special step for removing the filling metal layer 94 and the barrier metal 28 in the alignment hole 26. Therefore, according to this method, a manufacturing yield of the semiconductor devices 10 can be improved without increasing the number of steps, when compared to the conventional number of steps.

Figure 21:
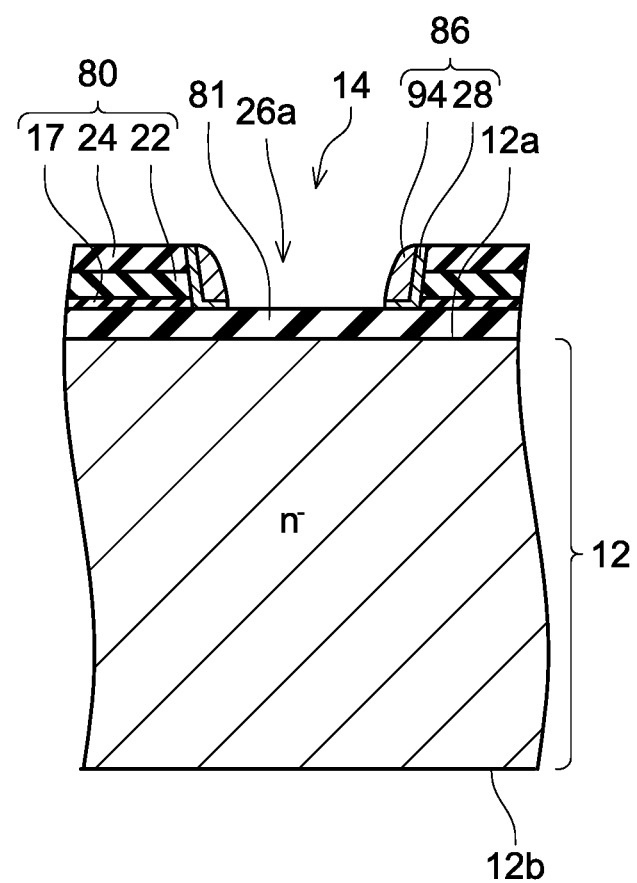
FIG. 21 shows a vertical cross-sectional view of an alignment hole 26a in a variation.

Notably, in the above-mentioned embodiment, the bottom surface of the alignment hole 26 is configured with the upper surface 12*a* of the semiconductor substrate 12. However, as shown in FIG. 21, an insulating film 81 may be disposed in the dicing portion 14, between the interlayer insulating film 80 and the semiconductor substrate 12, and the bottom surface of the alignment hole 26 may be configured with the insulating film 81.

Moreover, in the above-mentioned embodiment, the filling metal layer 94 and the barrier metal 28 are allowed to remain at the corner between the bottom surface and the lateral surface of the alignment hole 26. However, the filling metal layer 94 and the barrier metal 28 may completely be removed from the alignment hole 26.

Moreover, in the above-mentioned embodiment, the method for manufacturing the semiconductor device 10 having an IGBT has been described. However, the art disclosed in the present disclosure may also be applied to a manufacturing process of other semiconductor devices.

Moreover, in the case where a patterned structure needs to be formed on the lower surface 12*b* side of the semiconductor substrate 12 (e.g., a case where a p-type region and an n-type region are formed in a range exposed on the lower surface 12*b*), the position of the alignment hole 26 may be sensed, and position adjustment may be performed based on the sensed position, and a range of ion implantation into the lower surface 12b may be delimited.

Moreover, in the above-mentioned embodiment, an entirety of the contact plugs 86 may be made of tungsten.

Correspondence between the components in the embodiment and the components in the claims will hereinafter be described. The metal layer configured with the filling metal layer 94 and the barrier metals 28 in the embodiment is an example of a first metal layer in the claims. The step of forming the emitter electrode 56 and the step of forming the polyimide film 34 in the embodiment are an example of treatment of the semiconductor substrate based on the position of the alignment hole in the claims. The AlSi layer 92 in the embodiment is an example of a second metal layer in the claims.

Some of the configurations of the manufacturing method disclosed in the present disclosure will hereinafter be enumerated. Notably, any of the steps enumerated below is independently useful.

In a manufacturing method disclosed herein as an example, at least a part of the first metal layer may be made of tungsten.

Tungsten is widely used as a metal layer that fills a contact hole. In the case where at least a part of the first metal layer is made of tungsten, and if tungsten (the first metal layer) is deposited in the contact hole, the tungsten is also grown in the alignment hole. If the alignment hole, an inside of which is filled with tungsten, were cut, hard cutting chips of tungsten would be generated and damage the semiconductor device. However, in the manufacturing method disclosed in the present disclosure, since most part of the tungsten deposited in the alignment hole is removed, even in the case of using tungsten, damages to the semiconductor device by cutting chips can be suppressed.

A manufacturing method disclosed herein as an example may further comprise a deposition of a second metal layer. In the deposition of the second metal layer, the second metal layer may be deposited on the surface of the interlayer insulating film, a surface of the first metal layer, and the inner surface of the alignment hole after the etching of the first metal layer and before the treatment of the semiconductor substrate based on the sensed position of the alignment hole. The second metal layer may be subjected to patterning in the treatment based on the sensed position of the alignment hole so that the second metal layer remains on the first metal layer and is removed from above the part of the semiconductor substrate that is to be cut in the cutting.

According to this configuration, the second metal layer (the electrode layer) connected to the first metal layer can be formed. Moreover, the second metal layer is prevented from becoming cutting chips.

The cutting of the part including the alignment hole is performed in a state where at least a part of the bottom surface of the alignment hole is not covered with a metal. According to this configuration, the generation of metal cutting chips can be suppressed.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. A method for manufacturing a semiconductor device, the method comprising:
    forming an interlayer insulating film on a semiconductor substrate;
    etching a part of the interlayer insulating film to form a contact hole and an alignment hole in the interlayer insulating film, the alignment hole having a width wider than a width of the contact hole;
    depositing a first metal layer on a surface of the interlayer insulating film, an inner surface of the contact hole, and an inner surface of the alignment hole, the first metal layer having a thickness thicker than a half of the width of the contact hole and thinner than a half of the width of the alignment hole;
    etching the first metal layer so that the surface of the interlayer insulating film and a bottom surface of the alignment hole are exposed and the first metal layer remains covering a bottom surface of the contact hole;
    sensing a position of the alignment hole and treating the semiconductor substrate based on the sensed position of the alignment hole; and
    cutting a part of the semiconductor substrate including the alignment hole to divide a semiconductor device having the contact hole from the semiconductor substrate.

2. The method of claim 1, wherein at least a part of the first metal layer is made of tungsten.

3. The method of claim 1, further comprising depositing a second metal layer on the surface of the interlayer insulating film, a surface of the first metal layer, and the inner surface of the alignment hole after the etching of the first metal layer and before the treatment,
    wherein the second metal layer is subjected to patterning in the treatment based on the sensed position of the alignment hole so that the second metal layer remains on the first metal layer and is removed from above a part of the semiconductor substrate that is to be cut in the cutting.

* * * * *